(12) United States Patent
Yu et al.

(10) Patent No.: US 10,217,392 B2
(45) Date of Patent: Feb. 26, 2019

(54) TRANSPARENT DISPLAY DEVICE AND METHOD FOR CONTROLLING SAME

(71) Applicant: LG Display Co., Ltd., Seoul (KR)

(72) Inventors: Byung Chun Yu, Paju-si (KR); Eui Yeol Oh, Seoul (KR); Chae Youl Cho, Paju-si (KR); Ki Pyo Hong, Paju-si (KR); Joo Young An, Goyang-si (KR); Il Ho Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 109 days.

(21) Appl. No.: 14/758,751

(22) PCT Filed: Dec. 30, 2013

(86) PCT No.: PCT/KR2013/012398
§ 371 (c)(1),
(2) Date: Jun. 30, 2015

(87) PCT Pub. No.: WO2014/104858
PCT Pub. Date: Jul. 3, 2014

(65) Prior Publication Data
US 2015/0371579 A1    Dec. 24, 2015

(30) Foreign Application Priority Data
Dec. 31, 2012 (KR) .................. 10-2012-0157790
Dec. 31, 2012 (KR) .................. 10-2012-0157803

(51) Int. Cl.
*G09G 3/20* (2006.01)
*G09G 3/32* (2016.01)
*G09G 3/3208* (2016.01)

(52) U.S. Cl.
CPC .......... *G09G 3/2003* (2013.01); *G09G 3/20* (2013.01); *G09G 3/32* (2013.01); *G09G 3/3208* (2013.01);
(Continued)

(58) Field of Classification Search
CPC .......... G09G 3/30; G09G 3/32; G09G 3/3208; G09G 3/3216; G09G 3/3225; G09G 3/36;
(Continued)

(56) References Cited

U.S. PATENT DOCUMENTS 5,965,981 A * 10/1999 Inoguchi .............. B60K 35/00
                                                        313/503
6,362,835 B1 * 3/2002 Urbanus .................. G09G 3/20
                                                        345/589
(Continued)

FOREIGN PATENT DOCUMENTS

JP    2011-237696 A    11/2011
KR    2006-0015022     2/2006
(Continued)

OTHER PUBLICATIONS

PCT International Search Report, PCT/kr2013/012398, dated May 4, 2014, 4 Pages.
(Continued)

*Primary Examiner* — Alexander Eisen
*Assistant Examiner* — Nelson Lam
(74) *Attorney, Agent, or Firm* — Fenwick & West LLP

(57) ABSTRACT

Provided are a transparent display device and a method for controlling same. This transparent display device comprises: a sensor which measures the color properties of light that is incident to the transparent display device; a light control unit which is configured so as to control the amount of light that is incident to the rear surface of the transparent display unit and penetrates a plurality of penetration units; and a transparent display panel which comprises a control unit configured so as to correct color distortion by making a comparison with a preset threshold value on the basis of the measured color properties and correcting the image to be
(Continued)

displayed on a plurality of pixels, the transparent display panel displaying the corrected input image.

17 Claims, 25 Drawing Sheets

(52) U.S. Cl.
CPC ............ *G09G 2320/0242* (2013.01); *G09G 2320/066* (2013.01); *G09G 2320/0626* (2013.01); *G09G 2320/0673* (2013.01); *G09G 2360/14* (2013.01); *G09G 2360/144* (2013.01); *G09G 2360/145* (2013.01)

(58) Field of Classification Search
CPC ............ G09G 3/3607; G09G 3/2003; G09G 2320/0242; G09G 2320/0626; G09G 2320/066; G09G 2320/0673; G09G 2360/14; G09G 2360/144; G09G 2360/145
USPC .................... 345/76–83, 87–104; 315/169.3
See application file for complete search history.

(56) References Cited

U.S. PATENT DOCUMENTS

| | | | |
|---|---|---|---|
| 9,240,162 B2* | 1/2016 | Kim | G09G 5/10 |
| 2003/0184659 A1 | 10/2003 | Skow | |
| 2006/0239550 A1* | 10/2006 | Pulsifer | G06T 5/009 |
| | | | 382/168 |
| 2006/0262053 A1* | 11/2006 | Lee | G09G 3/3225 |
| | | | 345/76 |
| 2007/0040944 A1* | 2/2007 | Hong | H04N 9/77 |
| | | | 348/624 |
| 2007/0091055 A1 | 4/2007 | Sakuda | |
| 2007/0194702 A1 | 8/2007 | Jeng et al. | |
| 2008/0055535 A1* | 3/2008 | Chiba | C09K 19/60 |
| | | | 349/165 |
| 2009/0298547 A1 | 12/2009 | Kim et al. | |
| 2010/0013751 A1* | 1/2010 | Kerofsky | G09G 3/006 |
| | | | 345/89 |
| 2010/0165002 A1* | 7/2010 | Ahn | G09G 3/3648 |
| | | | 345/690 |
| 2010/0177114 A1 | 7/2010 | Nakashima | |
| 2010/0320919 A1 | 12/2010 | Gough et al. | |
| 2012/0306940 A1* | 12/2012 | Machida | G02B 6/005 |
| | | | 345/690 |
| 2012/0327331 A1* | 12/2012 | Yim | G02F 1/1362 |
| | | | 349/62 |
| 2013/0063471 A1 | 3/2013 | Sugiyama et al. | |
| 2013/0127924 A1* | 5/2013 | Lee | G09G 3/32 |
| | | | 345/690 |
| 2013/0147851 A1* | 6/2013 | Yim | H01L 27/32 |
| | | | 345/690 |
| 2013/0181615 A1* | 7/2013 | Lee | H01L 27/3232 |
| | | | 315/158 |
| 2013/0207948 A1* | 8/2013 | Na | G09G 3/003 |
| | | | 345/207 |
| 2014/0184577 A1* | 7/2014 | Kim | G09G 5/10 |
| | | | 345/207 |
| 2015/0356902 A1* | 12/2015 | Seo | G09G 3/3208 |
| | | | 345/589 |
| 2016/0097962 A1* | 4/2016 | Kim | G09G 5/10 |
| | | | 359/238 |
| 2016/0240125 A1* | 8/2016 | Sridharan | G09G 5/02 |
| 2017/0061889 A1* | 3/2017 | Seo | G09G 3/3685 |
| 2017/0213491 A1* | 7/2017 | Seo | G09G 3/2003 |
| 2018/0267313 A1* | 9/2018 | Kim | G02B 27/0172 |
| 2018/0268754 A1* | 9/2018 | Kim | G09G 3/2011 |

FOREIGN PATENT DOCUMENTS

| | | |
|---|---|---|
| KR | 2006-0103528 | 10/2006 |
| KR | 10-2007-0072188 A | 7/2007 |
| KR | 10-0741024 B1 | 7/2007 |
| WO | WO 2005-024501 A1 | 3/2005 |

OTHER PUBLICATIONS

Extended European Search Report for European Patent Application No. EP 13869681.0, dated Jul. 29, 2016, 9 Pages.

Office Action for Korean Patent Application No. KR 10-2015-7021927, dated Dec. 23, 2016, 9 Pages, (With Concise Explanation of Relevance).

European Patent Office, Summons to Attend Oral Proceedings Pursuant to Rule 115(1) EPC, EP Patent Application No. 13869681.0, dated May 16, 2018, 14 pages.

* cited by examiner

TRANSPARENT DISPLAY DEVICE AND METHOD FOR CONTROLLING SAME

FIELD OF THE INVENTION

The present invention relates to a transparent display device and a method for controlling the same, and more particularly, to a transparent display device and a method for controlling the same with which it is possible to improve visibility by minimizing light interference for an image displayed by the transparent display device.

BACKGROUND

A transparent display device is a display apparatus in which a background behind can be seen, and the transparent display device was primarily realized by projecting an image on a non-emissive liquid crystal panel. However, there has been currently developed a display apparatus that directly includes a transparent display device. As a liquid-crystal display (LCD) has an excellent shading ratio but uses two polarizing plates, the liquid-crystal display has low transmittance, thus it is difficult to be used as a transparent display device. Especially, the transparent display device is mostly realized by an organic light-emitting display (OLED) device capable of self-emitting. Such a transparent display device is applied to a front glass of a vehicle or a glass for home to provide a user with information on the display device and information of an ambient environment at the same time.

DETAILED DESCRIPTION OF THE INVENTION

Technical Solution

A transparent display device transmits light incident onto a back surface of the transparent display device directly to a user's eye due to light transmittance. Since the light incident onto the back surface is transmitted directly to the user's eye, the user can see an object beyond the back surface. The inventors of the present invention recognized that when a color noise appears from the back surface of the transparent display device, it may be difficult to recognize the information on the display apparatus due to the decreased difference in color or color distortion. Further, when light beyond the back surface of the transparent display device is bright, there may be a decrease in brightness between the region where information of the transparent display device is displayed and the region where information of the transparent display device is not displayed. Accordingly, it may be difficult to recognize the information. If a background beyond the back surface of the transparent display device is seen, visibility of an image displayed by the transparent display device is decreased.

The inventors of the present invention recognized that when a color noise appears from the back surface of the transparent display device, it is necessary to secure visibility of an image by adjusting brightness of the transparent display device.

Accordingly, an object to be achieved by the present invention is to provide a transparent display device and a method for controlling the same capable of improving visibility of an image displayed by the transparent display device and realizing a high-definition display.

Another object to be achieved by the present invention is to provide a transparent display device improved in power consumption, durability and reliability by image adjustment and panel drive control, and a method for controlling the same.

Yet another object to be achieved by the present invention is to provide a transparent display device reduced in a color noise incident into a back surface thereof, and a method for controlling the same.

Still another object to be achieved by the present invention is to provide a transparent display device which can be actively or passively applied to an external environment and provides a picture optimized for the external environment, and a method for controlling the same.

According to the present invention, there is provided a new transparent display device. The transparent display device includes a transparent display panel. The transparent display panel includes a plurality of pixels configured to display an image and a plurality of see-through portions disposed to be adjacent to the plurality of pixels. The transparent display device includes at least one optical sensor and a light control unit. The at least one optical sensor measures characteristics of light incident into a back surface of the transparent display panel. The light control unit controls an amount of light incident into the back surface of the transparent display panel and transmitted through the plurality of see-through portions. The transparent display device includes a controller, and the controller adjusts a transmittance of the light control unit and an image of the transparent display panel based on the characteristics of light. The transparent display device can be actively or passively applied to an external environment and provides a picture optimized for the external environment.

According to the present invention, there is provided a new transparent display device. The transparent display device includes a transparent display panel including a plurality of pixels configured to display an image and a plurality of see-through portions disposed to be adjacent to the plurality of pixels. Further, the transparent display device includes at least one optical sensor configured to measure color of external light incident into a back surface of the transparent display panel. The transparent display device includes a controller configured to adjust the image on the transparent display panel based on the color. The transparent display device can be improved in power consumption, durability and reliability by image adjustment and panel drive control. Further, the transparent display device can be reduced in a color noise incident into a back surface of the transparent display device.

The effects of the present invention are not limited to the aforementioned effects, and other various effects are included in the present specification.

DETAILED DESCRIPTION OF THE PREFERRED EMBODIMENTS

Figure 1:
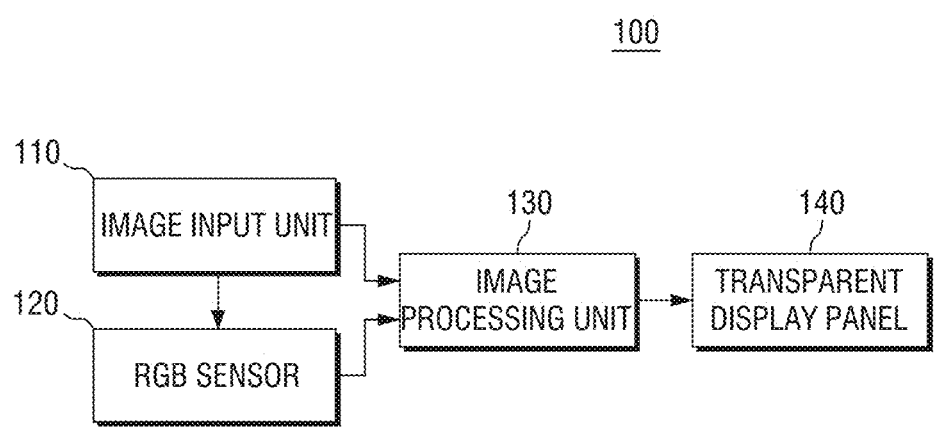
FIG. 1 is a block diagram of a transparent display device according to an exemplary embodiment of the present invention.

Various advantages and features of the present invention and methods accomplishing thereof will become apparent from the following description of embodiments with reference to the accompanying drawings. However, the present invention is not limited to exemplary embodiment disclosed herein but will be implemented in various forms. The exemplary embodiments are provided by way of example only so that a person of ordinary skilled in the art can fully understand the disclosures of the present invention and the scope of the present invention. Therefore, the present invention will be defined only by the scope of the appended claims.

Indicating that elements or layers are "on" other elements or layers include both a case in which the corresponding elements are just above and directly contacting other elements and a case in which the corresponding elements are intervened with other layers or elements.

Although first, second, and the like are used in order to describe various components, the components are not limited by the terms. The above terms are used only to distinguish one component from the other component. Therefore, a first component mentioned below may be a second component within the technical spirit of the present invention.

The term "image" as used herein means a visual image, and refers to all the elements displayed on a screen or a display apparatus. The image may include a video, a static image, a still, and the like. If the image is a video, the video may be comprised of a plurality of frames, and each of the frames may include a plurality of layers or regions. The image may be a two-dimensional image or a three-dimensional image. In the present specification, the image is processed in both of a case where the image is a two-dimensional image and a case where the image is a three-dimensional image. Therefore, hereinafter, both of a two-dimensional image and a three-dimensional image will be referred to as an image unless specifically mentioned otherwise.

The term "image signal" as used herein means an electrical signal converted and output from an image so as to be displayed on a screen or a panel of a display apparatus, and refers to a signal that enables image data to be transmitted and received.

The term "image processing" or "image adjustment" as used herein means a process performed to an input image through a signal processing by a processing unit or a processor so as to be suitable for a purpose, and includes both of an analog signal processing and a digital signal processing. Hereinafter, for sake of convenience in description, the image processing refers to a digital signal processing performed to an image, but is not limited thereto and can be broadly interpreted. Further, in the present specification, the image processing may include at least four processes including point processing, region processing, geometric processing, and frame processing. The point processing involves processing a pixel as a unit based on a pixel position. The region processing involves modifying a pixel value according to a neighboring pixel value of an original value of a pixel. The geometric processing involves changing a pixel position or a pixel array. The frame processing involves modifying pixel values by processing two or more images.

In the present specification, the term "transparent display device" means a display apparatus including at least a partial region of a screen seen by a user that is transparent. In the present specification, the transparent display device refers to a display apparatus having at least a transparency at which an object in back of the display device can be seen by the user. In the present specification, the transparent display device means, for example, a display apparatus in which a transparent display device has a transmittance of at least 20% or more. An amount of light incident into a back surface of the transparent display device and passing through the back surface can be determined depending on the transmittance of the transparent display device.

Hereinafter, light incident into a front surface of the transparent display device is reflected by at least 1% to 5%, and light incident into the back surface of the transparent display device is transmitted by, for example, 20% when taking account of only a light transmittance of the transparent display device. That is, a contrast ratio in the transparent display device depends on an ambient brightness, and, specifically, depends on the light incident into the back surface.

TABLE 1

| | Brightness | | | | | |
|---|---|---|---|---|---|---|
| | 200 lux | | | 2000 lux | | |
| | White (nit) | Black (nit) | Contrast ratio | White (nit) | Black (nit) | Contrast ratio |
| Incident into front surface | 200 | 3 | 66.66 | 400 | 203 | 1.97 |
| Incident into back surface | 240 | 40 | 6 | 600 | 400 | 1.5 |

Table 1 lists white/black luminance and a contrast ratio of a display apparatus in which 1.5% of light incident into a front surface is reflected under the environments with brightness of 200 lux and 2000 lux and a transparent display device in which 20% of light incident into a back surface is transmitted.

Referring to Table 1, the contrast ratio in the transparent display device is affected by both light incident into the front surface and light incident into the back surface. However, when taking account of only the brightness of 200 lux, a decrease in the contrast ratio caused by the light incident into the back surface is more noticeable than a decrease in the contrast ratio caused by the reflection of the light incident into the front surface. Accordingly, the transparent display device is configured so as to correspond to the light incident into the back surface, thereby improving the contrast ratio.

In the present specification, a front surface and a back surface of a transparent display device are defined in view of light emitted from the transparent display device. In the present specification, the front surface of the transparent display device refers to a surface on which light is emitted from the transparent display device, and the back surface of the transparent display device refers a surface opposite to the surface on which light is emitted from the transparent display device.

The term "color" as used herein refers to color characteristics of incident light or a displayed screen, and can be expressed by various color coordinates such as YUV, CMYK, HSV, and RGB, but in the present specification, for the sake of convenience in description, the color will be assumed and described as RGB color coordinates. Further, each color coordinate can be converted from RGB to HSV or from HSV to RGB taking account of a purpose of use or a computational amount if necessary.

In the drawings, size and thickness of each element are illustrated for convenience in description, and the present invention is not necessarily limited to those illustrated in the drawings.

Hereinafter, the present invention will be described in detail with reference to the accompanying drawings.

FIG. 1 is a block diagram of a transparent display device including an image processing device according to an exemplary embodiment of the present invention. A transparent display device 100 according to the exemplary embodiment of the present invention includes an image input unit 110, an RGB sensor 120, an image processing unit 130, and a transparent display panel 140.

An ambient environment projected to the transparent display device 100 has various brightness. For example, the brightness of an office is about 200 to 500 lux, the brightness of the shade of a building or forest in the daytime is about 20,000 to 30,000 lux, and the brightness of the sun in the daytime is about 50,000 to 100,000 lux. Due to such a brightness of environment, there are various variables that are involved in affecting the brightness of light incident into the transparent display device 100.

The user's eye varies depending on the brightness in an environment. For example, the user's eye is capable of clearly seeing an image with low luminance under the environment with low brightness of 200 lux, but is not capable of clearly seeing an image with low luminance under the environment with brightness of 30,000 lux. The user's eye is capable of clearly seeing an image with a small amount of light or is not capable of clearly seeing the image with high-luminance light by dilating or contracting the pupil depending on the brightness in an environment.

A display apparatus of the prior art includes a configuration for suppressing a surface reflection of the display apparatus so as to correspond to the brightness of an environment, but such a configuration is designed in consideration of only light reflected from a surface of the display apparatus. In the transparent display device 100, light incident into the back surface as well as light reflected from the surface needs to be considered. Further, since the light incident into the back surface of the transparent display device 100 is not a noise but may include information that the user needs, the luminance of an image displayed by the transparent display device and the light incident into the back surface need to be balanced under the various brightness. That is, by appropriately maintaining a balance between the displayed image and intensity of the light incident into the back surface, it is possible to achieve optimum visibility of the displayed image and an image on a see-through area.

In an aspect of the present invention, the transparent display device 100 includes a see-through area and an emissive area. The user's eye simultaneously receives a signal transferred from the see-through area and a signal transferred from the emissive area. In this case, light transmitted from the see-through area can be differently interpreted in terms of visibility and informativeness.

Informativeness in the transparent display device may be divided into informativeness of an image displayed on the transparent display device and informativeness of a background on the back surface of the transparent display device 100.

Further, visibility in the transparent display device 100 may be divided into visibility of the image displayed on the transparent display device 100 and visibility of the background on the back surface of the transparent display device 100. In terms of the visibility of the displayed image, the background on the back surface of the transparent display device 100 may be recognized as interference or noise for the displayed image. That is, in terms of the visibility of the displayed image, as an amount of light incident into the see-through area is decreased, the visibility of the displayed image may be improved.

Further, an incident light may have color properties. The light incident into the transparent display device 100 may have color of not only white but also all of natural colors depending on distribution of intensity for each wavelength. The incident light may be lighting or a sun light, and may have various information on colors depending on the lighting or a position of the sun. For example, an incandescent light and a fluorescent light may have various color temperatures, and a sun light may have different color at sunrise, sunset, morning, afternoon, and the evening. If the incident light has color, visibility of the displayed image may be greatly affected. That is, the overall color of an image displayed by the background of the transparent display device 100 may be distorted, and a specific color may be decreased in contrast ratio.

If a light having color is incident into the transparent display device 100 according to the exemplary embodiment of the present invention, the transparent display device 100 may measure the color of the incident light and adjust a color of an image displayed on the transparent display panel 140 based on the measured color. Therefore, the transparent display device 100 according to the exemplary embodiment of the present invention can improve visibility of the displayed image and also reduce power consumption by controlling emission from the transparent display panel.

The image input unit 110 is configured to receive an image and input the image to the image processing unit 130. The image input unit 110 may receive an image from an external device, a memory of the transparent display device 100, and a wired/wireless receiver. The image input unit 110 may be interfaced with a D-Sub, a DVI, an HDMI, an S-Video, a component, and the like. The image input unit 110 is configured to input the received image to the image processing unit 130.

The RGB sensor 120 is configured to measure color of a light incident into the transparent display device 100 including the RGB sensor 120 and transmits the measured color to the image processing unit 130. Hereinafter, the RGB sensor 120 may be referred to as a color sensor, a brightness sensor, a color photodiode, and the like.

The transparent display device 100 may be exposed to various light environments including a backlight, a direct light, light environments with different distributions, and the like. The transparent display device 100 may collect information relevant to various light environments through the RGB sensor 120, and may be configured to secure visibility of an image while recognizing an object on the back surface based on the information relevant to the light environment. Hereinafter, the RGB sensor 120 may be referred to as a light module, a photo diode, a photo transistor, and the like. The RGB sensor 120 of the transparent display device 100 may be configured to include various filters such as an HPF (High Pass Filter), an LPF (Low Pass Filter), and a BPF (Band Pass Filter), an ultraviolet film, and an infrared film so as to measure information of only a specific visible light range. That is, the RGB sensor 120 of the transparent display device 100 may be configured to filter an infrared light or ultraviolet light which may be measured as a noise.

According to the exemplary embodiment of the present invention, the RGB sensor 120 of the transparent display device 100 may be comprised of a single RGB sensor 120 or a combination of a plurality of RGB sensors 120. Otherwise, the RGB sensor 120 of the transparent display device 100 according to the exemplary embodiment of the present invention may be disposed as an independent RGB sensor 120 on a non-display part of the transparent display device 100. Hereinafter, for the sake of convenience in description, the RGB sensor 120 will be illustrated as being disposed on the transparent display panel 140 unless specifically mentioned otherwise, but the RGB sensor 120 may be mounted on a non-display area of the transparent display panel.

In the following description, the RGB sensor 120 of the transparent display device 100 according to the exemplary embodiment of the present invention may be a combination of three color sensors respectively configured to measure colors of R, G, and B. However, the RGB sensor 120 may be comprised of a single color sensor, or may be an image sensor including a plurality of pixels.

A measured value of light incident into the RGB sensor 120 of the transparent display device 100 according to the exemplary embodiment of the present invention may be converted into a digital signal so as to correspond to R, G, B color coordinates, and the converted signal may be referred to as R, G, B measurement values of the incident light.

The image processing unit 130 is configured to receive the image from the image input unit 110, receive the color of the light incident into the transparent display device 100 from the color sensor, and adjust or process the image based on the received color of the light. The image processing unit 130 may generate an image signal for displaying the image. The image processing unit 130 may transmit the generated image signal to the transparent display panel 140.

The transparent display panel 140 is configured to receive the image signal processed by the image processing unit 130 and display the image by outputting the image signal. The transparent display panel 140 performs a function of displaying a result of the image processing of the image processing unit 130. In the present specification, the transparent display panel 140 may be used interchangeably as a transparent display device, a transparent display, and the like. The transparent display device 100 according to the exemplary embodiment of the present invention may be configured to include various transparent display panels 140.

The transparent display panel 140 of the transparent display device 100 according to the exemplary embodiment of the present invention may be a transparent organic light-emitting display device. An organic light-emitting display device refers to a display device in which a current flows in an organic light-emitting layer and thus the organic light-emitting layer emits light. The transparent organic light-emitting display device emits a light having a specific wavelength by using an organic light-emitting layer. The transparent organic light-emitting display device includes, at least, a cathode, an organic light-emitting layer, and an anode. Further, the transparent organic light-emitting display device may include an emissive area where a display light is emitted and a see-through area where an incident light is transmitted. Since the see-through area is adjacent to the emissive area, when a light incident into the see-through area is excessively bright, the intensity of light in the emissive area is relatively weakened. Thus, the user of the transparent display device is capable of seeing only light in the see-through area. Accordingly, a contrast ratio under a light condition or gamma curve properties under the light condition may be variably changed depending on brightness of the see-through area.

Further, the transparent display panel 140 may be driven in a passive matrix and an active matrix, and driving of the transparent organic light-emitting display device will be described in detail with reference to FIG. 3.

The transparent organic light-emitting display device may be configured as a top-emission type and a bottom-emission type. A top-emission organic light-emitting display device refers to an organic light-emitting display device in which light emitted from an organic light-emitting element is released to a top side of the organic light-emitting display device. It also means an organic light-emitting display device in which light emitted from an organic light-emitting element is released in a direction toward a top surface of a substrate on which a thin film transistor for driving the organic light emitting display apparatus is formed. A bottom-emission organic light-emitting display device refers to an organic light-emitting display device in which a light emitted from an organic light-emitting element is released to a bottom side of the organic light-emitting display device. It means an organic light-emitting display device in which a light emitted from an organic light-emitting element is released in a direction toward a bottom surface of a substrate on which a thin film transistor for driving the organic light-emitting display device is formed. Further, the transparent organic light-emitting display device may also be configured as a dual emission type. A dual-emission organic light-emitting display device refers to an organic light-emitting display device in which a light emitted from an organic light-emitting element is released to a bottom side and a top side of the organic light-emitting display device, and means that an organic light-emitting display device can be driven as a top-emission type and a bottom-emission type at the same time. In each of the top-emission organic light-emitting display device, the bottom-emission organic light-emitting display device, and the dual-emission organic light-emitting display device, a thin film transistor, an anode, and a cathode are disposed so as to be optimized for each emission type, so that the thin film transistor cannot interfere with an emission direction of the light-emitting element. In the following description, for the sake of convenience in description, the transparent organic light-emitting display device will be assumed and described as being configured as a top-emission type.

Hereinafter, a configuration of the transparent display panel 140 according to an exemplary embodiment of the present invention will be described in detail.

Figure 2:
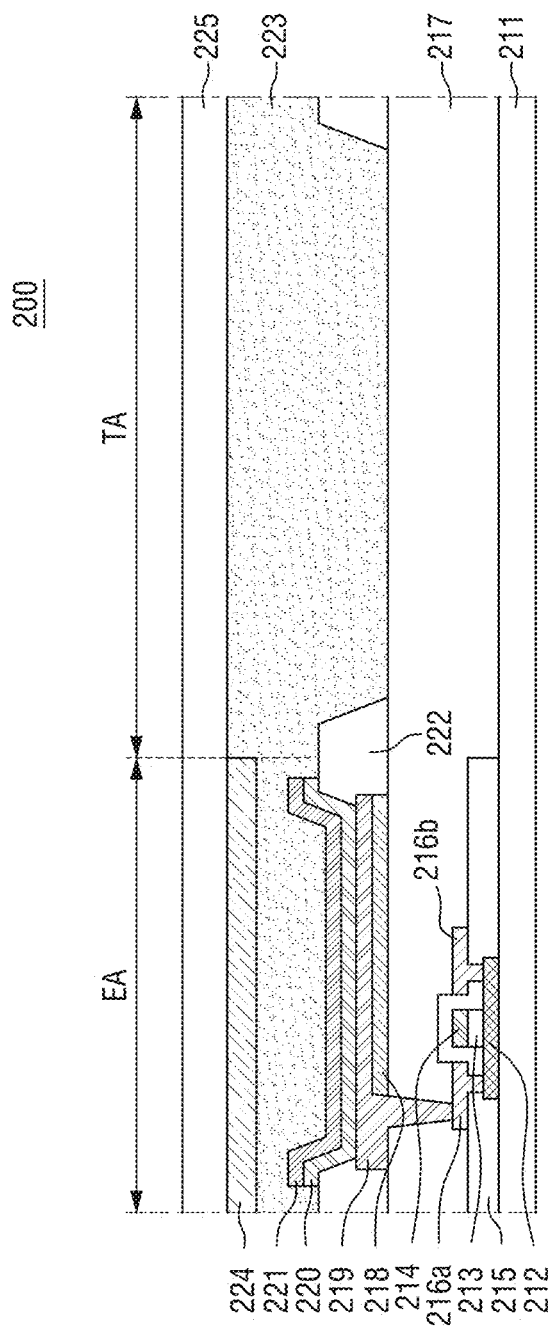
FIG. 2 is a schematic cross-sectional view of the transparent display device according to an exemplary embodiment of the present invention.

FIG. 2 is a schematic cross-sectional view of the transparent display device according to an exemplary embodiment of the present invention. FIG. 2 illustrates a transparent display panel 200. The transparent display panel 200 may be a transparent organic light-emitting display device configured to display an image.

The transparent display panel 200 may include a plurality of pixel regions. The plurality of pixel regions is configured to display a color, and may include a plurality of sub-pixel regions. Each of the plurality of pixel regions may include a red (R) sub-pixel region, a green (G) sub-pixel region, and a blue (B) sub-pixel region, and may further include a white (W) sub-pixel region in order to reduce power consumption and improve luminance. In the present specification, the pixel region may be referred to as a pixel, and the sub-pixel region may be referred to as a sub-pixel. In the following description, for the sake of convenience in description, the pixel will be described as including R, G, and B sub-pixels, but may not be limited thereto. A single pixel may be realized so as to include various sub-pixels. The R, G, and B sub-pixels may have respectively different opening ratios and may be disposed in various forms and sizes. For example, the R, G, and B sub-pixels may be disposed in a row and may be disposed so as to have respectively different areas. Each of the R, G, and B sub-pixels may independently emit light. If one sub-pixel emits light, the other sub pixels may emit light in a small amount, so that luminance of the one sub-pixel may be improved. For example, if the G sub-pixel emits light, the R and B sub-pixels may also emit light in a small amount. Even in this case, the user cannot recognize differences but can only see the color green (G).

A first substrate 211 may include a pixel region including a red sub-pixel region, a green sub-pixel region, and a blue sub-pixel region, and may further include a white sub-pixel region. The first substrate 211 may include a plurality of pixel regions. If the first substrate 211 includes a plurality of pixel regions, the first substrate 211 may include a plurality of red sub-pixel regions, a plurality of green sub-pixel regions, and a plurality of blue sub-pixels and may further include a plurality of white sub-pixel regions. If the first substrate 211 includes a plurality of pixel regions, the plurality of pixel regions may be disposed in various repetitive forms. FIG. 2 illustrates only one sub-pixel region for the sake of convenience in description, and the illustrated sub-pixel region may be one of a red sub-pixel region, a green sub-pixel region, a blue sub-pixel region, and a white sub-pixel region.

A sub-pixel region of the transparent display panel 200 includes an emissive area EA and a see-through area TA. The emissive area EA is also referred to as an emissive part, and the see-through area TA is also referred to as a see-through portion. The emissive area EA is an area where an actual image is realized, and the see-through area TA is an area where external light from a back surface of a transparent display device is transmitted. Accordingly, when the transparent organic light-emitting display device is not driven, the user is capable of seeing a background through the see-through area TA, i.e., an object on a back surface of the transparent display device. Meanwhile, when the transparent display device is driven, the user is capable of simultaneously seeing an image of the emissive area EA and the background through the see-through area TA. Although it has been illustrated in FIG. 2 that an area of the see-through area TA of a sub-pixel region is greater than that of the emissive area EA, an area ratio of the emissive area EA to the see-through area TA in the sub-pixel region may be variously set in terms of visibility and transmittance.

Hereinafter, a specific configuration of the transparent display panel will be described. Referring to FIG. 2, the transparent display panel 210 includes the first substrate 211, an active layer 212, a gate insulating film 213, a gate electrode 214, an interlayer insulating film 215, a source electrode 216*b*, a drain electrode 216*a*, an overcoat layer 217, a reflective layer 218, an anode 219, an organic light-emitting layer 220, a cathode 221, and a bank layer 222. The active layer 212, the gate insulating film 213, the gate electrode 214, the interlayer insulating film 215, the source electrode 216*b* and the drain electrode 216*a* constitute a thin-film transistor, and the anode 219, the organic light-emitting layer 220 and the cathode 221 constitute an organic light-emitting element. The organic light-emitting element includes a sealing part 223, a color filter 224, and a second substrate 225. FIG. 2A illustrates a case where the transparent display panel 210 is a top-emission organic light-emitting display device.

Figure 3:
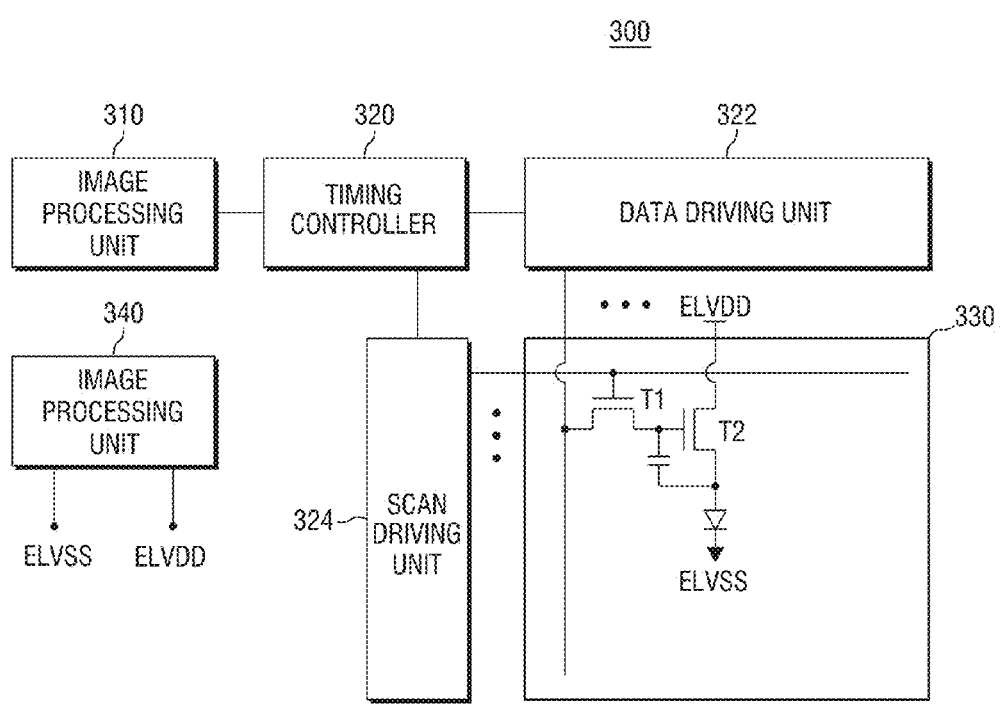
FIG. 3 is a block diagram for describing an operation of a transparent display device according to an exemplary embodiment of the present invention.

FIG. 3 is a block diagram for describing an operation of a transparent display device according to an exemplary embodiment of the present invention. A transparent display device includes an image processing unit 310, a timing controller 320, a transparent-display-unit panel 330, a data driving unit 322, a scan driving unit 324, and a power supply unit 340.

The timing controller 320 may be formed on one integrated circuit or may be patterned on the panel, and the timing controller 320 and the data driving unit 322 may be provided in various forms such as COG (Chip on Glass), COF (Chip on Film), PCB, and FPCB (Flexible Circuit Board).

The image processing unit 310 supplies a adjusted image to the timing controller 320. The adjusted image may be an image adjusted based on color of an incident light received by the image processing unit 310 from a color sensor.

The timing controller 320 may be referred to as a driving unit, and the driving unit generates a scan control signal based on the adjusted image to control the scan driving unit 324, and generates a data signal to control the data driving unit 322.

The data driving unit 322 receives the data signal from the timing controller 320. The data signal may include various signal formats such as LVDS (low-voltage differential signal), MIPI (mobile industry processor interface), and RGB. The data driving unit 322 converts the data signal through a gamma voltage corresponding to the data signal, and luminance of a pixel is controlled by determining an amount of current flowing in the anode and the cathode of the organic light-emitting element.

The scan driving unit 324 is operated by driving the scan lines so that data signal is inputted to corresponding sub-pixels to the scan lines. The scan driving unit 324 may have various structures depending on a method for forming a sub-pixel. For example, if the sub-pixel further includes a deviation compensating circuit of a transistor, the scan driving unit may include a deviation sampling scan driving unit for compensating a deviation of the transistor, an emission driving unit for allowing the corresponding pixel to emit light after sampling is performed, and a discharge driving unit for discharge of the pixel. Further, the scan lines connected with the scan driving unit may further include sampling scan lines, emission scan lines, and discharge scan lines.

The scan driving unit 324 may supply one scan line signal or a plurality of scan line signals for selecting the scan line or the plurality of scan lines to the transparent-display-unit panel 330.

The power supply unit 340 supplies various voltages required in the data driving unit 322, the scan driving unit 324, and the anode and the cathode of the transparent-display-unit panel 330. The power supply unit 340 supplies ELVDD, ELVSS, VDD, and VSS. The power supply unit 340 may be configured to have a separate IC form. The power supply unit 340 may further include a DC/DC converter and a PWM driving unit in order to supply a required voltage.

In the following description, driving of a transparent display panel of a transparent display device according to an exemplary embodiment of the present invention will be described. The transparent-display-unit panel 330 includes a plurality of scan lines, a plurality of data lines, and a plurality of transparent-display-unit sub-pixels. FIG. 3 illustrates a single transparent-display-unit sub-pixel for the sake of convenience in description. The scan lines are extended in one direction, and the data lines are extended in a direction intersecting the one direction. Each of the sub-pixels includes a switching thin film transistor connected with each scan line and each data line and a driving thin film transistor connected with an anode electrode.

The timing controller 320 generates a data signal and a scan control signal based on the image signal supplied from the image processing unit 310. The timing controller 320 supplies the scan control signal for controlling the transparent-display-unit panel 330 to the scan driving unit 324 and the data signal to the data driving unit 322.

The scan driving unit 324 is connected with one end of the scan lines. The scan driving unit 324 generates a plurality of scan signals by using the scan control signal supplied from the transparent-display-unit timing controller 324 and gate on/off voltages supplied from a voltage generator, and applies the scan signals to gate lines disposed on the transparent-display-unit panel 330.

The scan driving unit 324 may include a plurality of gate driver ICs. The gate driver IC may include a plurality of switching elements directly formed on a peripheral region of the transparent-display-unit panel 330 by the same process as a switching element of a sub-pixel.

The data driving unit 322 is connected to one end of the data lines. The data driving unit 322 receives the data signal supplied from the timing controller 320 and gamma voltages. The gamma voltages may be supplied from a gamma IC. The data driving unit 322 converts the data signal into an analog signal based on the gamma voltages through a DAC corresponding to a gamma voltage generator. The gamma voltages may be supplied from the gamma voltage generator.

One end of the data lines may be connected with the transparent-display-unit data driving unit 322 through an MUX. Since the MUX is added, the number of lines connected with a panel and a data driver IC can be reduced.

In order for the organic light-emitting layer to emit light by using the image information of the input data signal, a switching thin film transistor T1 and a driving thin film transistor T2 may be used. According to the plurality of thin film transistors, the number of scan lines electrically connected with one pixel can be changed, and the scan lines or the thin film transistors may have various arrays and designs.

Figure 4:
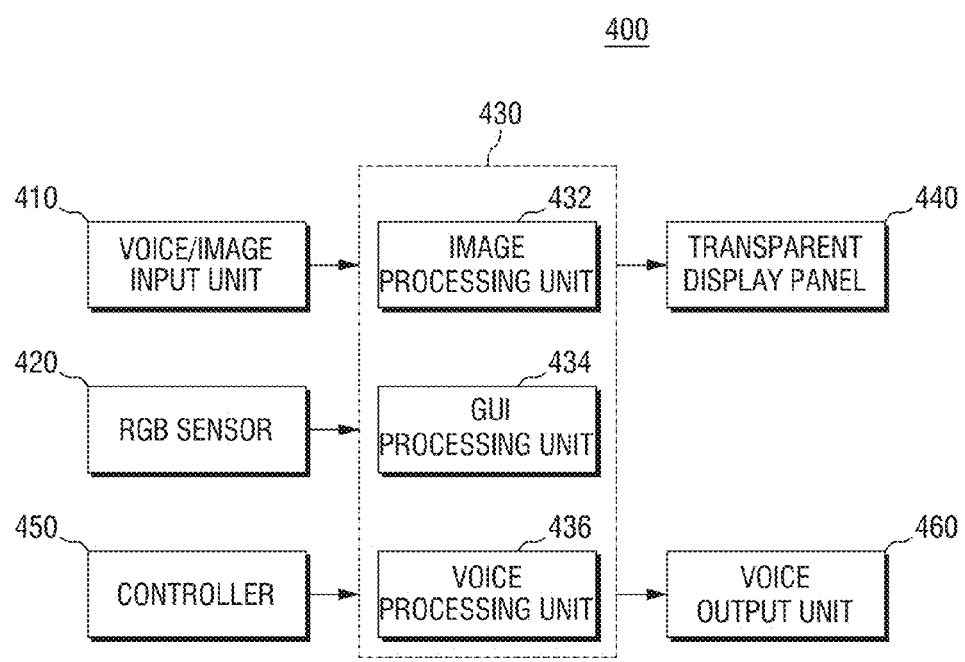
FIG. 4 is a block diagram illustrating a system of a transparent display device according to an exemplary embodiment of the present invention.

FIG. 4 is a block diagram illustrating a system of a transparent display device according to an exemplary embodiment of the present invention. A transparent display device 400 according to the exemplary embodiment of the present invention includes a voice/image input unit 410, an RGB sensor 420, a processing unit 430, a transparent display panel 440, a controller 450, and a voice output unit 460. Further, the processing unit 430 includes an image processing unit 432, a GUI processing unit 434, and a voice processing unit 436.

FIG. 4 illustrates a configuration in which a system of the transparent display device 400 receives and processes and then outputs a voice and an image. However, the system of the transparent display device 400 may be configured to process and display only the image without processing the voice. That is, the system of the transparent display device 400 is not limited to the illustrated configuration, and each component in the system of the transparent display device 400 may be realized by the components in other forms capable of performing the same function.

Although FIG. 4 illustrates the processing unit 430 is one module and the processing unit 430 includes a plurality of modules therein for the sake of convenience in description, various functions of the system of the transparent display device 400 may be realized as being implemented in one module. A controller 450 of FIG. 4 may be configured or realized as one module including the processing unit 430.

The voice/image input unit 410 is configured to receive a voice or an image and input the voice or image to input the processing unit 430. The voice/image input unit 410 may receive a voice or an image from an external device, a memory of the transparent display device 400, and a wired/wireless receiver. The voice/image input unit 410 inputs a voice or an image acquired by a communication means to the processing unit 430.

The RGB sensor 420 is configured to measure color of light incident into one surface of the transparent display device 400.

The RGB sensor 420 measures a color of incident light, and outputs color for each RGB (Red-Green-blue) channel as an output signal. The RGB sensor 420 may further include a filter unit configured to filter the output signal from the RBG sensor 420 and an analog-digital converter (ADC) configured to convert the output signal in an analog form into a digital form.

The RGB sensor 420 outputs the measured color of light as an analog value, and the output value is converted into a digital value by the ADC converter. The converted value is inputted to the processing unit 430 including the image processing unit 432.

The controller 450 controls an operation of the system of the transparent display device 400. The controller 450 may operate the system in response to a command of the user, or may operate the system according to a preset operation. For example, the controller 450 may control the processing unit 430 to adjust an image displayed according to color of light incident into the transparent display device 400, and may give a command to the processing unit 430 to adjust an image for driving in a power saving mode according to the color of the incident light or control an operation of the transparent display panel 440.

The above-described operations can be selected by a separate input unit in the system. For example, the transparent display device includes an input unit, and whenever there is an input through the input unit, a plurality of modes may be changed in sequence. Such a physical input unit can be usefully used when visibility of the transparent display device 400 is sharply decreased. When visibility is sharply decreased, it is difficult for the user to see menus displayed on the transparent display panel 440, and, thus, it may be difficult to select a mode that the user needs.

Further, the controller 450 may be configured to automatically set an operation by comparing the color measured by the color sensor with a preset value.

The processing unit 430 is configured to process an image or a voice input under the control of the controller 450 and supply an image signal to the transparent display panel 440. The processing unit 430 may include the image processing unit 432, the GUI processing unit 434, and the voice processing unit 436.

The image processing unit 432 may perform pre-treatments, such as decoding, noise removal, contrast ratio adjustment, and image scaling to the input image. If the image is a three-dimensional image, the image processing unit 432 may perform signal processing to each of an image for the left eye and an image for the right eye. Further, the image processing unit 432 may perform image processing or adjustment to the image based on the color of the incident light measured by the RGB sensor 420.

The image processing unit 432 may generate an image signal for displaying the image on the transparent display panel 440. The image processing unit 432 may output the generated image signal to the transparent display panel 440.

The GUI processing unit 434 may access a GUI (Graphic User Interface) of the system of the transparent display device 400 from the memory and process the GUI so as to be displayed on the transparent display device 400.

The voice processing unit 436 performs signal processing, such as decoding, noise removal, and normalizing to the input voice. The voice processing unit 436 processes the voice so as to be time-synchronized with the image, and outputs the signal-processed voice to the voice processing unit 436.

The transparent display panel 440 may be a transparent organic light-emitting display device as described above, and receives the image signal and displays the image. The transparent display panel 440 displays the image on the emissive area and transmits light through the see-through area.

The voice output unit 460 receives a voice signal from the voice processing unit 436 and outputs the voice. The voice output unit 460 may be a speaker, and a volume of the voice may be adjusted by the controller 450.

Hereinafter, there will be described a method for adjusting an input image by the image processing unit 432 of the transparent display device 400 according to the exemplary embodiment of the present invention based on color characteristics of incident light measured by the RGB sensor 420.

The image processing unit 432 processes an input image based on the measured color. The image processing unit 432 may perform image processing to adjust brightness of the input image, or may perform image processing to adjust color of the input image.

The image processing unit 432 may extract RGB values for each pixel from the input image. The RGB values for each pixel are R, G, and B values displayed on one pixel. Each of the R, G, and B values may have a gray scale value of 0 to 255. The R, G, and B values are not limited to 256 values and may have 2n values and may also include various values based on the number of colors of an input image, a compression format, or the like. The RGB values may be expressed as [r, g, b]. As described above, a color of a pixel can be defined by various color coordinates, but will be defined and described as RGB color coordinates for the sake of convenience in description.

Further, color input from the RGB sensor 420 may be expressed as [r, g, b]. The RGB sensor 420 may include independent sensors respectively for the colors R, G, and B, and may convert incident luminance or a color value for each sensor into RGB color coordinates and output the RGB color coordinates.

In the transparent display device 400 according to the exemplary embodiment of the present invention, a sub-pixel of the transparent display panel 440 includes an emissive area and a see-through area. The emissive area is an area to display light of an input image, and the see-through area is an area to transmit light incident into the back surface of the transparent display device 400. The light incident into the back surface of the transparent display device 400 may include color.

When the light incident into the back surface of the transparent display device 400 includes color, an image displayed by the transparent display device 400 may be displayed as being color-distorted. For example, if a red light is incident into the back surface of the transparent display device 400, an image originally desired to be displayed may be displayed as being overlapped with the color red. In this case, a color of the image is distorted, and, thus, the overall visibility and color impression of the image may deteriorate.

The transparent display device 400 according to the exemplary embodiment of the present invention performs image processing for adjusting color distortion caused by light incident into the transparent display device 400, and, thus, improves visibility of an image and expresses the image in color close to an original color.

The image processing unit 432 adjusts RGB values for each pixel based on the measured color of the incident light. The adjustment of RGB values for each pixel by the image processing unit 432 based on the measured color of the incident light can be realized by various methods. For example, the image processing unit 432 may change all of RGB values for each pixel of an input image. The image processing unit 432 extracts a histogram for each color of the input image and adjusts the color histogram, thereby adjusting the RGB values of the input image. Further, the image processing unit 432 adjusts a gamma curve for each color of the input image, thereby adjusting a color.

The transparent display device 400 according to the exemplary embodiment of the present invention is not limited thereto, and may adjust a color of an input image by various methods.

The image processing unit 432 of the transparent display device 400 according to the exemplary embodiment of the present invention may subtract or compensate for RGB values of a pixel based on RGB values of light incident into the back surface in order to display an original input image by offsetting a color of the incident light. When the RGB values of the pixel different from the RGB values of the incident light are compensated, color impression or a color temperature of the image may be compensated. The configuration for adjusting RGB values of a pixel based on RGB values of incident light will be described in detail with reference to FIG. 5.

The image processing unit 432 adjusts histogram data for each color of the input image, thereby adjusting the input image based on the measured RGB values of the incident light. The image processing unit 432 may obtain histogram data for each color of the input image.

The histogram data for each color are data written by dividing a scope where an image is present by $2n$ number of sections for each of the colors, for example, R, G, and B and detecting the frequency of appearance of data in each section.

The image processing unit 432 can perform various kinds of image processing based on the histogram data for each color. The image processing unit 432 may perform image processing by analyzing the histogram data for each color.

In the present specification, when the transparent display device 400 according to the exemplary embodiment of the present invention performs image processing so as to correspond to color of incident light, histogram shifting, histogram stretching, and the like will be exemplified, but the present invention is not limited thereto. The transparent display device 400 can perform color adjustment of an input image based on color of incident light by various kinds of image processing.

Further, when the RGB values of the incident light are equal to or lower than preset threshold values, the image processing unit 432 does not perform image processing, but only when they are equal to or higher than the threshold values, the image processing unit 432 performs image processing. Or, the image processing unit 432 does not perform image processing when the RGB values of the incident light are equal to or higher than preset threshold values, but performs the image processing only when they are equal to or lower than the threshold values.

The preset threshold values may be determined by the histogram data for each color. If a color distribution of one color is relatively high in the color distribution, a threshold value for the corresponding color may be determined to be higher than those of the other colors.

If a specific color of RGB of incident light has a relatively high value, the above-described adjustment of RGB values of an input image cannot sufficiently improve visibility. The image processing unit 432 may compare the color of the incident light input from the RGB sensor 420 with color of a pixel. If the image processing unit 432 determines that a color of a sub-pixel cannot be seen by a color of the incident light, the image processing unit 432 may limit brightness of the sub-pixel.

Further, the image processing unit 432 may limit displaying of light in a sub-pixel based on a color of incident light in order to reduce power consumption. If a color value of incident light is higher than a color value of an input image, the image processing unit 432 may limit brightness of a sub-pixel of the image based on color of the incident light, thereby adjusting RGB values for each pixel of the image.

For example, when incident light includes color expressed as [255, 0, 0], visibility of R in an image input to the transparent display device 400 may decrease. The image processing unit 432 may adjust the image such that R of the colors is not displayed in a pixel of the input image based on the color of the incident light. In the transparent display device 400, the corresponding sub-pixel does not emit light due to the adjusted image. Therefore, it is possible to reduce power consumption while maintaining the visibility. Since an actually input image is lower in brightness than an external light, the user substantially cannot see the image even if a display apparatus emits light. Therefore, limitation on an image is carried out. The transparent display device 400 according to the exemplary embodiment of the present invention can reduce power consumption by limiting emission of an image.

In the transparent display device 400 according to the exemplary embodiment of the present invention, as described above, an image may be adjusted by comparing color of incident light with color of an image. However, if a color of incident light is detected higher than a preset value without comparison, the color may be limited in brightness.

The limitation in color brightness of an image based on color of incident light may be realized by controlling driving of the transparent display device 400 rather than adjusting the image. For example, if incident light has a color value equal to or higher than a preset B value, the image processing unit 432 may generate or adjust a control signal so as to limit the brightness of a B sub-pixel of the transparent display panel 440. The configuration for limiting RGB values of a pixel based on RGB values of incident light will be described in detail with reference to FIG. 6.

The image processing unit 432 of the transparent display device 400 according to the exemplary embodiment of the present invention may adjust the luminance of the input image to be increased in order to improve the visibility of the input image based on the color of the incident light measured by the RGB sensor 420.

If a light of a specific color is incident into the back surface of the transparent display device 400, the contrast ratio of the corresponding color in a displayed image may be decreased. That is, if a red light is incident, it may be difficult to distinguish the color red having various brightness levels in an image. The image processing unit 432 of the transparent display device 400 increases the luminance of the color in the input image so as to correspond to the color of the incident light, thereby improving the visibility of the input image.

For example, if a light incident into the transparent display device 400 is a blue light, image processing unit 432 of the transparent display device 400 adjusts an image so as to increase the luminance of a blue sub-pixel of an input image, or generates or adjusts a control signal for the transparent display panel 440. The adjustment of an image to increase the luminance of a sub-pixel by the image processing unit 432 based on color of incident light will be described in detail with reference to FIG. 7.

Figure 5:
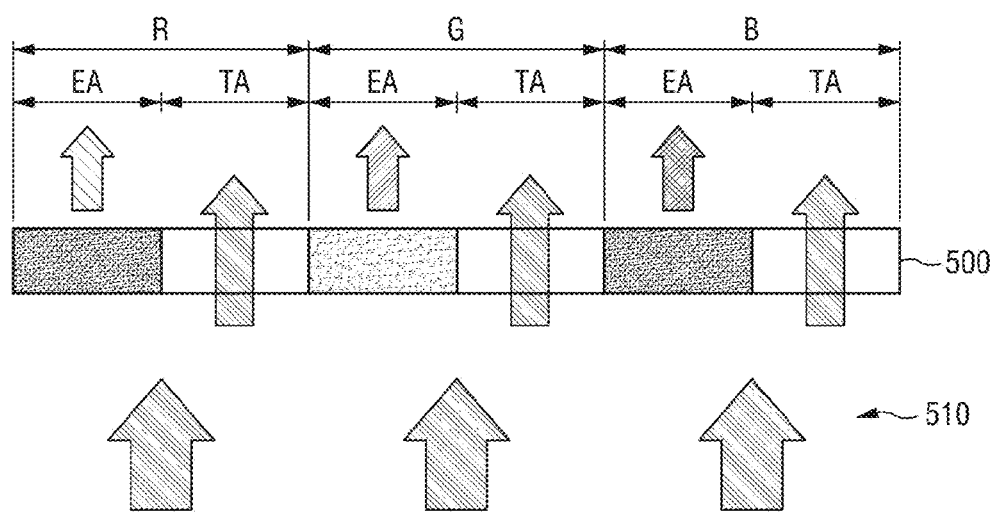
FIG. 5 and FIG. 6 are schematic cross-sectional views illustrating a pixel of the transparent display device according to an exemplary embodiment of the present invention.
Figure 6:
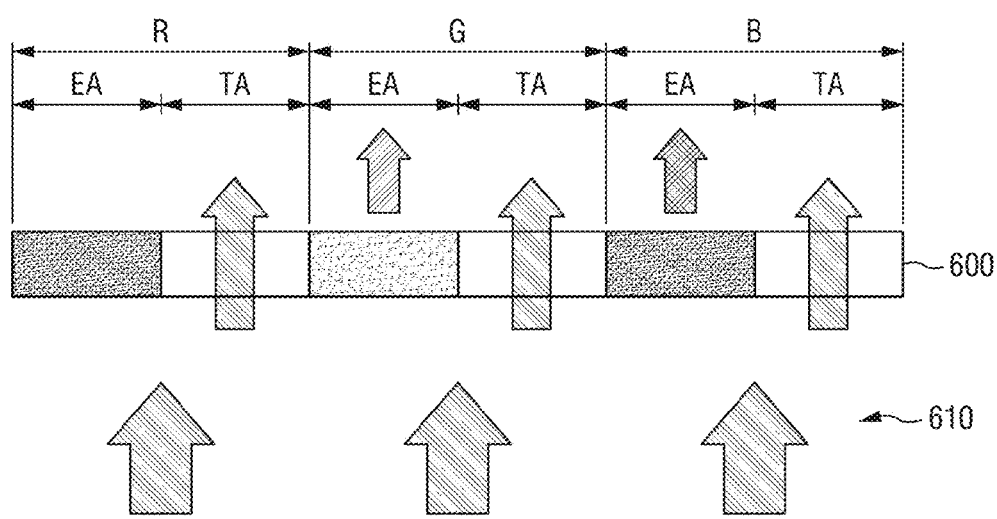

FIG. 5 and FIG. 6 are schematic diagrams illustrating a transparent display device according to an exemplary embodiment of the present invention. The transparent display device includes an R sub-pixel, a G sub-pixel, and a B sub-pixel, and each of the sub-pixels includes an emissive area and a see-through area. On the emissive area, a light of a color corresponding to each sub-pixel may be emitted, and on the see-through area, a light incident into a back surface of the transparent display device may be transmitted. FIG. 5 and FIG. 6 illustrate that there is a single see-through area for each emissive area, but such illustration is provided to easily explain the invention but does not limit the present invention. That is, the emissive area and the see-through area may be different in number and area.

In the following description, "[ ]RGB" means RGB values of one pixel including an emissive area, a see-through area, and RGB sub-pixels; "[ ]TA(RGB)" means RGB values of one pixel including RGB sub-pixels in a see-through area; "[ ]EA(RGB)" means RGB values of one pixel including RGB sub-pixels in an emissive area; "[ ]R" means RGB values of an R sub-pixel including an emissive area and a see-through area; "[ ]EA(G)" means RGB values in an emissive area of a G sub-pixel; and "[ ]TA(G)" means RGB values in a see-through area of a G sub-pixel.

FIG. 5 illustrates that RGB values for each pixel of an image are adjusted based on color of an incident light 510 measured by a transparent display device according to an exemplary embodiment of the present invention. Then the adjusted input image is displayed on a pixel 500 of a transparent display panel of the transparent display device.

For example, a pixel of an image input to the transparent display device may have RGB values of [200, 200, 200]EA(RGB). Color of the incident light 510 measured by a RGB sensor of the transparent display device according to the exemplary embodiment of the present invention is expressed as [40, 0, 0]. That is, the light expressed as [40, 0, 0] is incident into each see-through area of the transparent display device. That is, it can be understood that the lights having RGB values of [40, 0, 0]TA(R), [40, 0, 0]TA(G), and [40, 0, 0]TA(B) may be respectively transmitted through see-through areas of R, G, and B sub-pixels of the transparent display device.

If the transparent display device does not adjust RGB values of an input image, a color expressed as [(200+40×3), 200, 200]RGB may be seen by the user. That is, the intensity of a red light is relatively increased, so that a color of the image may be considerably distorted.

The transparent display device according to the exemplary embodiment of the present invention may adjust the RGB values of the input value to [(200−40×3), 200, 200] EA(RGB), i.e., [80, 200, 200]EA(RGB) based on the measured color of the incident light 510 in order to adjust the above-described color distortion.

The transparent display device may display the adjusted image on the transparent display panel. The pixel 500 of the transparent display panel is adjusted so as to emit a light having RGB values of [80, 200, 200]EA(RGB). The lights having RGB values of [40, 0, 0]TA(R), [40, 0, 0]TA(G), and [40, 0, 0]TA(B) may be respectively transmitted through see-through areas of the R, G, and B sub-pixels. Therefore, when the RGB values of the light emitted from the emissive area are added to the RGB values of the lights transmitted through the see-through areas, the RGB sub-pixels display lights having RGB values of [120, 0, 0]R, [40, 200, 0]G, and [40, 0, 200]B, respectively, and the pixel 500 displays [200, 200, 200]RGB as RGB values of a pixel of an originally inputted image.

As a result, if the pixel 500 of the transparent display device displays an input image having adjusted RGB values, the transparent display device may display a light having RGB values of [200, 200, 200]RGB of the originally input image under the incident light 510 expressed as [40, 0, 0].

Subtraction of RGB values of a pixel may be adjusted according to the RGB values of the incident light 510. Further, considering that each color may have different visibility, a weighted value may be given to each color to subtract the RGB values. An image processing unit may adjust RGB values of a pixel of an input image based on the color of the incident light 510 and a lookup table in which RGB values of the image to be subtracted for each of color are defined.

FIG. 6 illustrates that RGB values for each pixel of an image are adjusted based on color of an incident light 610 measured by a transparent display device according to another exemplary embodiment of the present invention, and then the adjusted input image is displayed on a pixel 600 of a transparent display panel of the transparent display device.

The pixel 600 of the input image may have RGB values of [240, 240, 240]RGB. If color of the incident light 610 measured by a RGB sensor of the transparent display device according to the exemplary embodiment of the present invention is expressed as [80, 0, 0], the lights having RGB values of [80, 0, 0]TA(R), [80, 0, 0]TA(G), and [80, 0, 0]TA(B) may be respectively transmitted through see-through areas of R, G, and B sub-pixels. An image processing unit may adjust an R sub-pixel to have a value of [0, 0, 0]EA(R), i.e., not to emit light if the transparent display panel is an organic light-emitting display device, based on the measured color of the incident light 610.

The transparent display device may display the adjusted image on the transparent display panel. In the transparent display panel, emissive areas of the G and B sub-pixels emit the lights having RGB values of [0, 240, 0]EA(G), and [0, 0, 240]EA(B), respectively, and an emissive area of the R-sub-pixel does not emit light. The lights having RGB values of [80, 0, 0]TA(R), [80, 0, 0]TA(G), and [80, 0, 0]TA(B) may be respectively transmitted through see-through areas of the R, G, and B sub-pixels. Therefore, when the RGB values of the lights emitted from the emissive areas are added to the RGB values of the lights transmitted through the see-through areas, the RGB sub-pixels displays lights having RGB values of [80, 0, 0]R, [80, 240, 0]G, and [80, 0, 240]B, respectively, and the user can see a color corresponding to [240, 240, 240]RGB from the pixel.

If the pixel 600 displays RGB values of the adjusted image, the transparent display device according to the exemplary embodiment of the present invention limits emission of the R sub-pixel, thereby reducing power consumption and also extending durability of an organic light-emitting material.

The transparent display device may determine whether or not to apply the above-described adjustment by comparing RGB values of the incident light 610 with preset threshold values. The threshold values may be set to RGB values at which a color of an input image cannot be seen by a color of the incident light 610 even if the color of the input image is emitted on the transparent display device. The transparent display device may perform the above-described adjustment when a light having RGB values equal to or higher than the preset threshold values is incident.

Further, when the RGB values of the incident lights 510 and 610 are higher than RGB values of an input image, for example, if adjustment is performed while limiting a red sub-pixel, the adjustment may not be sufficient just by limiting emission of the red sub-pixel since a color of the incident light is relatively strong. Therefore, in this case, the transparent display device additionally increase the brightness of the other non-limited sub-pixels, thereby compensating for color impression and visibility of the image at the same time.

For example, when the lights having RGB values of [80, 0, 0]TA(R), [80, 0, 0]TA(G), and [80, 0, 0]TA(B) are transmitted through see-through areas of the R, G, and B sub-pixels, if the input image is [200, 200, 200]RGB, even if the limitation on emission of the R sub-pixel is performed as illustrated in FIG. 6, the input image becomes [240, 200, 200]RGB. Thus, there may be a relative difference in color between each of R, G, and B and a change in color to be seen. Therefore, the transparent display device additionally increase the brightness of the G and B sub-pixels, thereby realizing [240, 240, 240]RGB and thus improving color impression and visibility.

Figure 7:
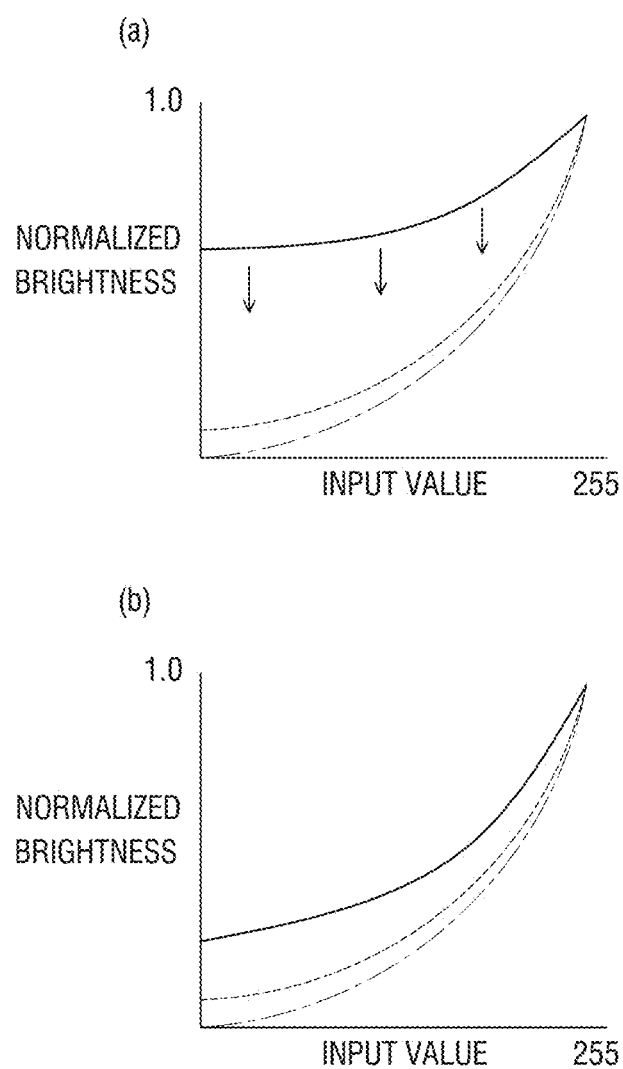
FIG. 7 is a schematic diagram illustrating a gamma curve of an image displayed by a transparent display device according to an exemplary embodiment of the present invention.

FIG. 7 is a schematic diagram illustrating a gamma curve of an image displayed by a transparent display device according to an exemplary embodiment of the present invention. In graphs of (a) and (d) of FIG. 7, an x-axis indicates input values of 0 to 255, and is an axis indicating values from the darkest input value to the brightest input value of an image. A y-axis is an axis indicating luminance represented as a normalized value of 0 to 1.0. In the graphs, a solid line is a gamma curve for blue (B), an alternate long and short dash line is a gamma curve for green (G) and red (R), and a dotted line is a gamma curve for a combination of red, green, and blue.

(a) of FIG. 7 illustrates gamma curves for respective colors in a transparent display device when an incident light having RGB values of [0, 0, 30] is incident into a back surface of the transparent display device. Due to a blue component of the incident light, a low input value part of the gamma curve for blue of the transparent display device is increased as compared with the gamma curve for green and red. An image having the gamma curves as illustrated in (a) of FIG. 7 is decreased in contrast ratio for blue, and, thus, may have a low visibility.

The transparent display device according to the exemplary embodiment of the present invention may display an image by increasing luminance of an input image based on color of incident light measured by an RGB sensor such that the visibility of the input image can be improved. The increase in luminance of the image may include an increase in the maximum luminance of a color by adjusting the image and varying a gamma voltage.

The transparent display device according to the exemplary embodiment in the present invention may display an image adjusted so as to increase luminance of blue in the input image. If the luminance of blue is increased as compared with green and red, the contrast ratio is also increased in spite of an effect of light incident into the back surface, and the overall visibility of blue may be increased.

(b) of FIG. 7 illustrates gamma curves for respective colors of the transparent display device when an image in the transparent display device is adjusted so as to increase the luminance of blue under the same condition as (a) of FIG. 7. The solid gamma curve for blue exhibits an improvement in grayscale expression in the overall range of input values. It also exhibits a partial improvement in grayscale improvement with respect to the gamma curve for red and green and the entirety thereof.

Referring to (b) of FIG. 7, it can be seen that by increasing the luminance of blue, a contrast ratio for blue is increased. Further, in spite of interference of blue incident light, as the luminance of blue is increased, the visibility of blue may also be increased.

Figure 8:
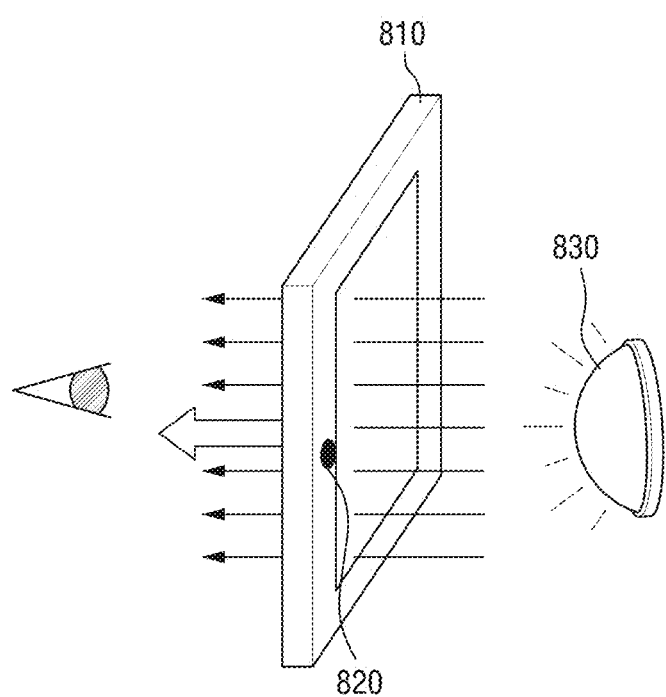
FIG. 8 is a schematic diagram of a transparent display device according to an exemplary embodiment of the present invention.

FIG. 8 is a schematic diagram of a transparent display device according to an exemplary embodiment of the present invention. Referring to FIG. 8, a transparent display device 810 includes a color sensor 820 provided on a back surface of the transparent display device 810. A thick arrow from the transparent display device 810 illustrates that the transparent display device 810 displays a adjusted image in a direction toward the user. The color sensor 820 may be disposed in a non-display area of a transparent display panel. A light source 830 emits light toward a back surface of the transparent display device 810. The light incident into the back surface of the transparent display device 810 may have a color and may be called backlight. A part of the backlight may be reflected from an interface of the transparent display device 810 and the remaining part of the backlight is transmitted through the transparent display device 810 as illustrated in FIG. 8.

The light source 830 refers to all kinds of lightings configured to emit or reflect light in order for the light to be incident into the transparent display device 810 according to the exemplary embodiment of the present invention, but is not limited thereto. The light source 830 may be a sun light or may include all kinds of lightings configured to emit light. Furthermore, the light source 830 may include all kinds of objects configured to reflect light.

Referring to FIG. 8, a backlight having a color is transmitted through the transparent display device 810 and can be seen by the user as being mixed with an image displayed by the transparent display panel. Under the backlight, the transparent display device 810 may adjust the input image based on color measured by the color sensor 820 disposed on the back surface in order to suppress color distortion of a displayed image and increase the visibility of the image as illustrated in FIG. 6 above.

Figure 9:
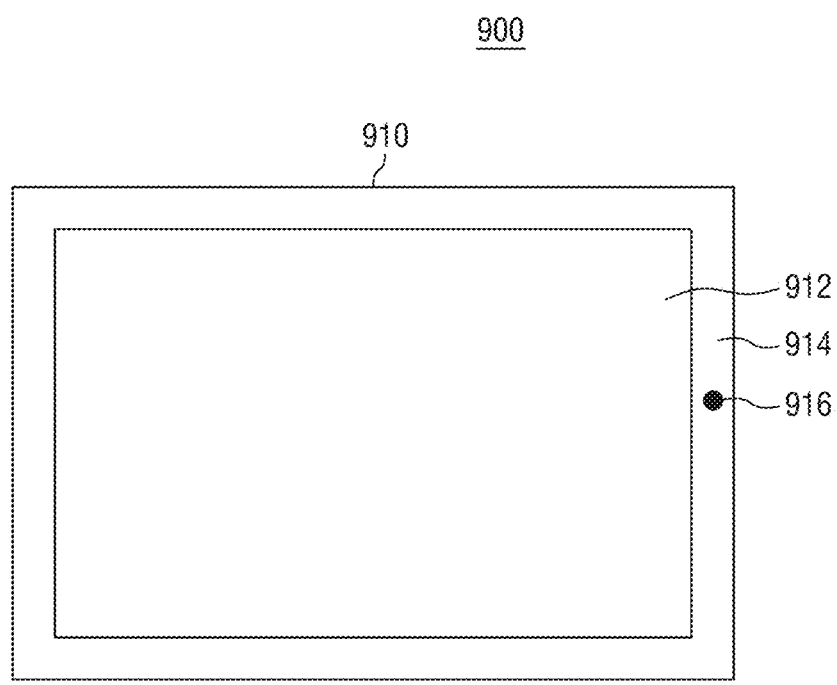
FIG. 9 is a plan view of a transparent display device according to an exemplary embodiment of the present invention.

FIG. 9 is a plan view of a transparent display device according to an exemplary embodiment of the present invention. FIG. 9 illustrates a position of a color sensor 916 in the transparent display device according to the exemplary embodiment of the present invention. The transparent display device according to the exemplary embodiment of the present invention includes a light-see-through display area 912 and a non-display area 914.

In the transparent display device according to the exemplary embodiment of the present invention, the position of the color sensor 916 is not limited. The color sensor 916 may be disposed at any position as long as the color sensor is disposed on one surface of the transparent display device to measure light incident into the color sensor 916. In the transparent display device according to the exemplary embodiment of the present invention, the color sensor 916 may be disposed on the front surface, the back surface or a side surface of the transparent display device. For example, when the transparent display device includes a plurality of sensors, the plurality of color sensors 916 may be independently driven, and the transparent display device may recognize positional information of the color sensors 916. The color sensor 916 can be disposed within a pixel of a transparent display panel. As the number of the color sensors 916 increases, accuracy in measurement of a color may increase.

In FIG. 9, the color sensor 916 of the transparent display device is disposed in the non-display area 914 on one surface of the transparent display device. In order to measure the light incident into the transparent display device with more accuracy, the color sensor 916 may be disposed at the center of the transparent display device.

Figure 10:
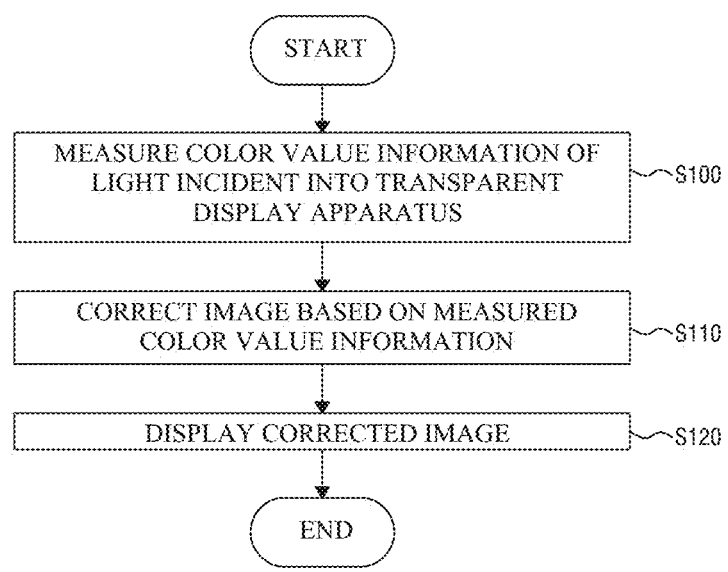
FIG. 10 is a flowchart illustrating a method for controlling a transparent display device according to an exemplary embodiment of the present invention.

FIG. 10 is a flowchart illustrating a method for controlling a transparent display device according to an exemplary embodiment of the present invention. For the sake of convenience in description, the method for controlling a transparent display device is described with reference to a processor, a color sensor, and a transparent display of the transparent display device. Further, all steps may be independently performed, but are described as one procedure in the following description for the sake of convenience in description.

The color sensor measures color of light incident into the transparent display (S100).

The processor receives the color of the incident light from the color sensor, receives an input image, and adjusts the input image based on the measured color (S110). The processor performs image processing to the input image based on the measured color. The processor may perform image processing in order to adjust luminance of the input image, or may perform image processing in order to adjust color of the input image.

The transparent display displays the adjusted image (S120). The adjusted image may be obtained by adjusting RGB values of the input image based on RGB values of the incident light. The adjusted image may be obtained by adjusting at least one of RGB values of the input image to be limited based on RGB values of the incident light. The adjusted image may be obtained by limiting at least one corresponding value of R, G, and B values of the input image in order for a sub-pixel of the transparent display not to emit light when at least one of RGB values of the incident light exceeds a preset threshold value. The adjusted image may be obtained by increasing luminance of one corresponding value of RGB values of the input image based on RGB values of the incident light.

Hereinafter, a transparent display device including a light control unit according to an exemplary embodiment of the present invention will be described. If an external light incident into a back surface of the transparent display device is too strong, the maximum luminance of the transparent display device is relatively weakened with respect to the external light. That is, visibility of an image displayed by the transparent display device is decreased in proportion to an amount of external light incident into the back surface of the transparent display device. Therefore, the light control unit for securing visibility of an image by adjusting an amount of external light incident into the back surface of the transparent display device may be further included.

Figure 11A:
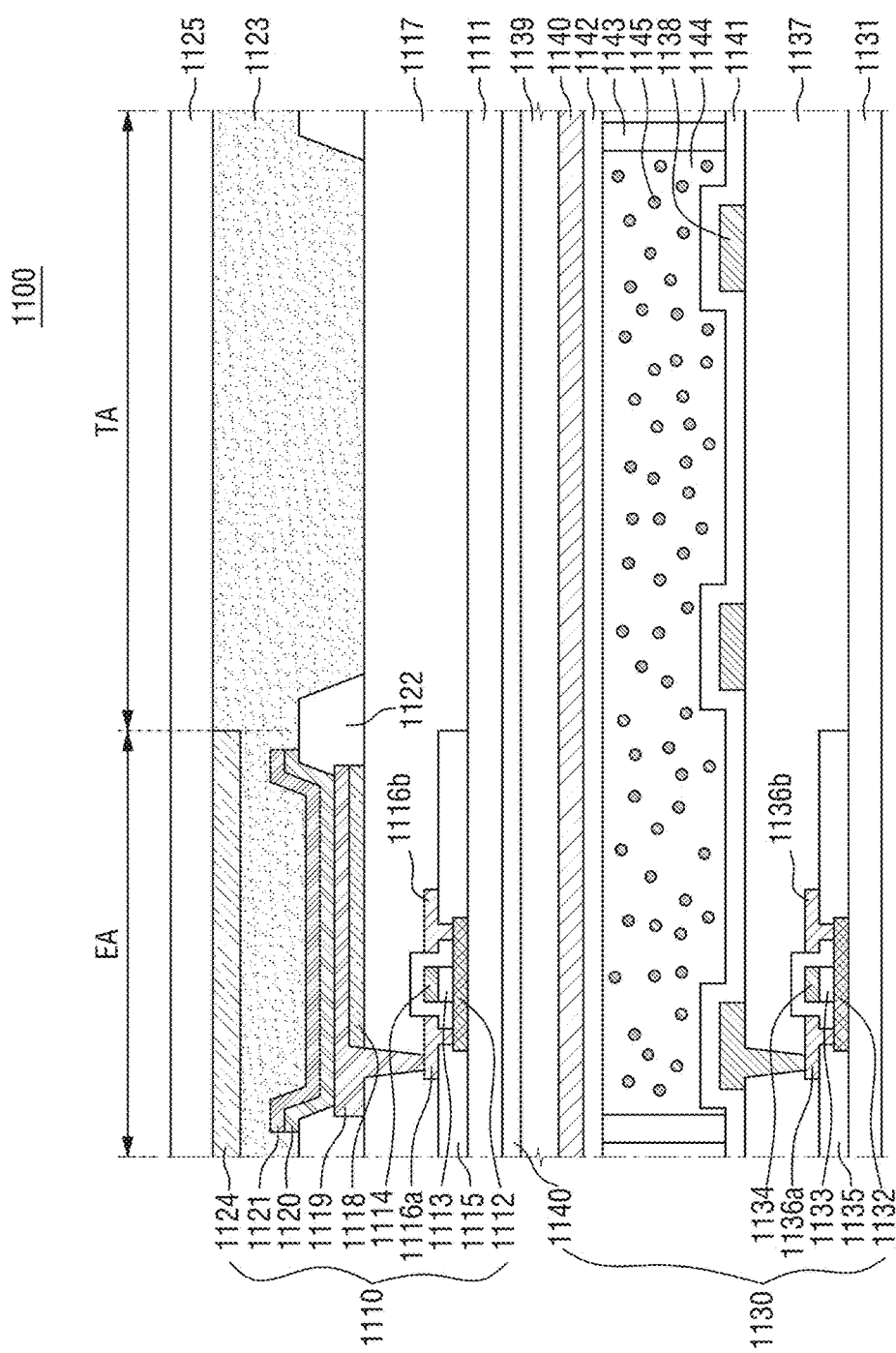
FIG. 11A is a schematic cross-sectional view of a transparent display device according to an exemplary embodiment of the present invention.

FIG. 11A is a schematic cross-sectional view of a transparent display device including a light control unit according to an exemplary embodiment of the present invention. FIG. 11A illustrates a transparent display panel 1110 and a light control unit 1130. The transparent display panel 1110 may be a transparent organic light-emitting display device in which an image is displayed, and the light control unit 1130 may be a charged-particle control device in which light transmittance is controlled.

Referring to FIG. 11A, the light control unit 1130 includes a third substrate 1131, an active layer 1132, a gate insulating film 1133, a gate electrode 1134, an interlayer insulating film 1135, a source electrode 1136b, a drain electrode 1136a, an overcoat layer 1137, first electrodes 1138, a second electrode 1140, protection layers 1141 and 1142, a fluid 1144 including charged particles 1145, and partition walls 1143.

The light control unit 1130 is attached to the transparent display panel 1110. Referring to FIG. 11A, the transparent organic light-emitting display device is disposed on the light control unit 1130 by using a transparent adhesive or a transparent adhesive layer. In FIG. 11A, although it has been illustrated that the light control unit 1130 is disposed under the transparent display panel 1110, and the light control unit 1130 may be formed on the transparent display panel 1110. The light control unit 1130 and the transparent display panel 1110 of the transparent display device 1100 may be independently driven, and may selectively control incident light.

Figure 11B:
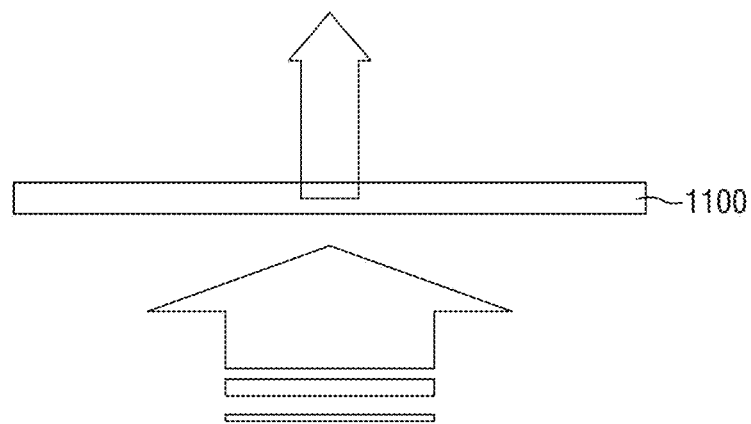
FIG. 11B and FIG. 11C are schematic diagrams illustrating light incident into the transparent display device according to an exemplary embodiment of the present invention.

FIG. 11B is a schematic diagram illustrating light incident into the transparent display device according to the exemplary embodiment of the present invention. FIG. 11B illustrates light incident into one light receiving point of the back surface of the transparent display device 1100. Unless specifically mentioned, the "light incident" or "incident light" in the present specification means light incident into one surface of the transparent display device 1100. The light incident into the one surface of the transparent display device 1100 can be measured by an illuminance sensor included in the area of the transparent display device 1100 where light is not emitted or any sensor disposed to measure the incident light.

Referring to FIG. 11B, the light incident into the one surface of the transparent display device 1100 may include all kinds of light incident at an angle of 0° to 180° with respect to the substrate as well as light vertically incident into the transparent display device 1100. However, for the sake of convenience in description, although incident light which has quadrature components by being incident into the transparent display device 1100 at a right angle or by being refracted in the transparent display device 1100 is described, incident light not having the quadrature components may be described similarly to the incident light that enters at a right angle.

Figure 11C:
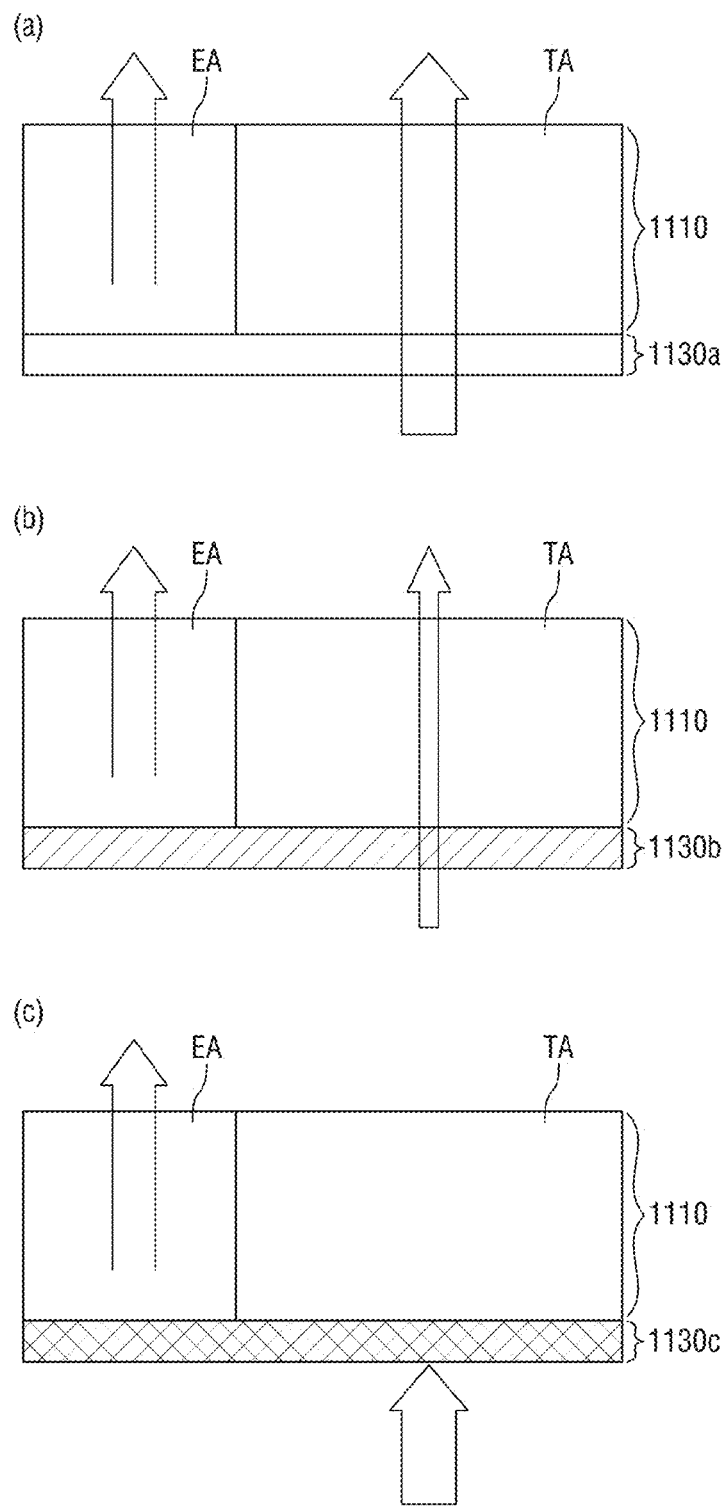

FIG. 11C illustrates the light incident into the transparent display device 1100 according to the exemplary embodiment of the present invention under the control of light control units 1130a, 1130b, and 1130c. Furthermore, the transparent display device 1100 includes an emissive area and a see-through area as described above. In the emissive area, a driving transistor and an organic light-emitting element are disposed to emit light, and in the see-through area, light may be incident into the back surface of the transparent display device 1100. Also, the transparent display device 1100 includes the light control units 1130a, 1130b and 1130c, and the light control units 1130a, 1130b and 1130c may be configured to have different light transmittance values depending on an intensity of a voltage to be applied.

In (a), (b), and (c) of FIG. 11C, it is assumed that light rays having the same intensities are emitted in the emissive part and light rays incident into the transparent display device 1100 are constant. In (a) of FIG. 11C, the light control unit 1130a is controlled to allow all the incident light rays to be transmitted. When the light control unit 1130a is controlled to allow all the incident light rays to be transmitted, the user sees both light emitted from the emissive part and light incident from the back surface of the transparent display device 1100.

In (b) of FIG. 11C, the light control unit 1130b is controlled to allow a part of incident light to be transmitted. When the light control unit 1130b is controlled to allow a part of incident light to be transmitted, since the user is capable of more clearly seeing emitted light as compared with (a) of FIG. 11C, the visibility of the transparent display device is relatively improved.

In (c) of FIG. 11C, the light control unit 1130c is controlled to further decrease the transmittance of the incident light. When the light control unit 1130c is controlled to further shield the incident light, since the user is capable of more clearly seeing emitted light as compared with (a) and (b) of FIG. 11C, the visibility of the transparent display device is improved, but it may be difficult to see an object on the back surface of the transparent display device 1100.

In the transparent display device 1100 including the light control unit according to the exemplary embodiment of the present invention, since the light control units 1130a, 1130b, and 1130c control the transmittance, it is possible to control the transparent display device 1100 such that the transparent display device 1100 can be controlled to increase the visibility for the user of the transparent display device 1100.

Figure 12:
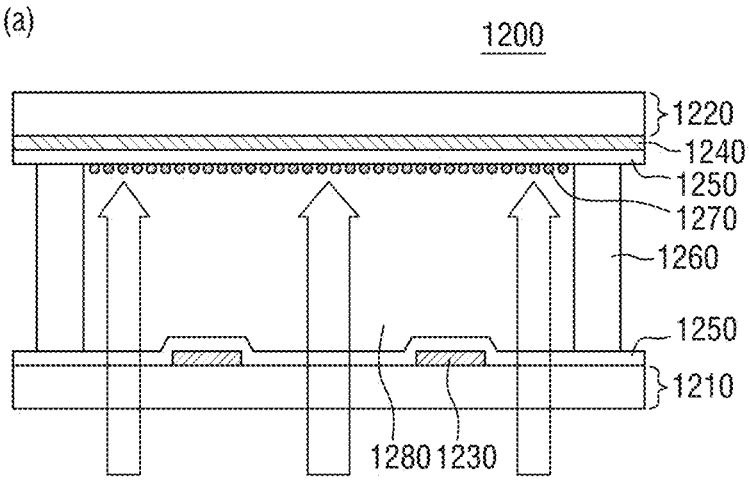
FIG. 12 illustrates schematic diagrams illustrating a light control unit of the transparent display device according to an exemplary embodiment of the present invention.
Figure 12:
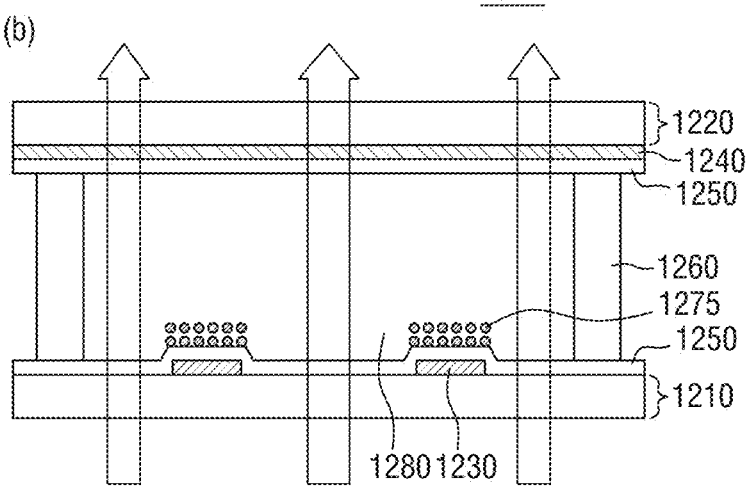

FIG. 12 illustrates schematic diagrams illustrating a light control unit of the transparent display device according to the exemplary embodiment of the present invention. In (a) and (b) of FIG. 12, a third substrate 1210, a fourth substrate 1220, a first electrode 1230, a second electrode 1240, partition walls 1260, a protection layer 1250 and a fluid 1280 are the same as the third substrate 1131, the fourth substrate 1139, the first electrode 1138, the second electrode 1140, the partition walls 1143, the protection layers 1141 and 1142 and the fluid 1144 described in FIG. 11A. Thus, the redundant descriptions thereof will be omitted.

In (a) of FIG. 12, light incident into a light control unit 1200 passes through the third substrate 1210, reaches black charged particles 1270, and is then absorbed by the black charged particles 1270. Since the incident light is shielded by an arrangement of the black charged particles 1270, such a state of the transparent display device is called a shield state.

In (b) of FIG. 12, light incident into the fourth substrate 1220 sequentially passes through the third substrate 1210, the second electrode 1240, and the fourth substrate 1220 so as to pass through the light control unit 1200. Since the incident light is transmitted by an arrangement of black charged particles 1275, such a state of the light control unit 1200 is called a see-through state or a transparent state.

Alternatively, only a part of the incident light is transmitted between the black charged particles. Since the transmitted part of the light is transmitted through all of the see-through areas, the object on the back surface of the transparent display device can be seen at an upper part of the transparent display device. The remaining part of the incident light reaches the black charged particles and is absorbed by the black charged particles. Since the incident light is transmitted or shielded by the spread of the black charged particles 1270 and 1275, such a state of the light control unit 1200 is called a translucent state.

In the translucent state in which only a part of the incident light is transmitted, the transmittance is variably controlled depending on time applied or intensity of a voltage applied to the first electrode 1230 or the second electrode 1240 of the light control unit 1230.

Figure 13:
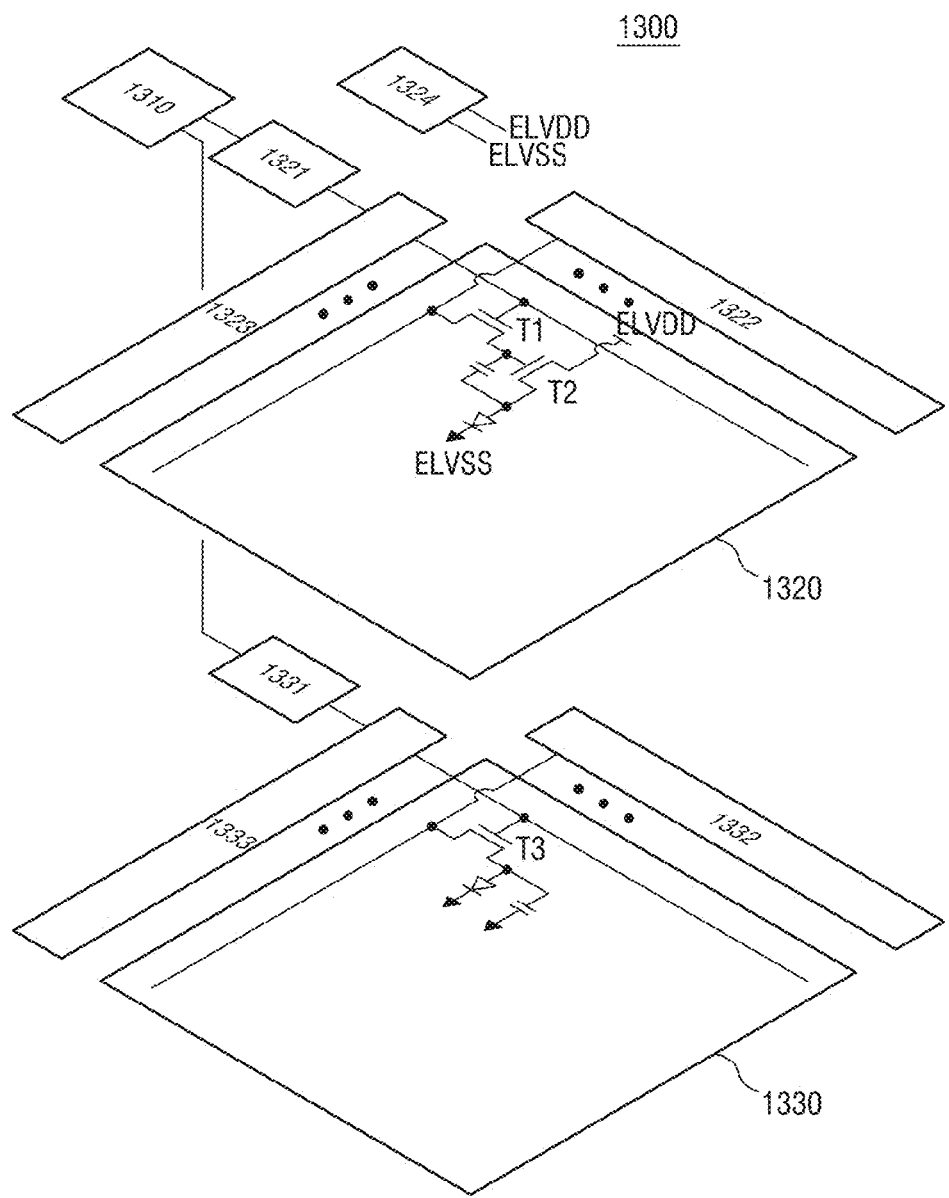
FIG. 13 is a schematic diagram of a transparent display device according to an exemplary embodiment of the present invention.

FIG. 13 is a schematic diagram of a transparent display device according to an exemplary embodiment of the present invention. A transparent display device 1300 includes a processing unit 1310, a transparent-display-unit timing controller 1321, a transparent-display-unit panel 1320, a transparent-display-unit data driving unit 1322, a transparent-display-unit scan driving unit 1323, a light-control-unit timing controller 1331, a light-control-unit panel 1330, a light-control-unit data driving unit 1332, and a light-control-unit scan driving unit 1333.

The timing controllers 1321 and 1331 may be formed on one integrated circuit or may be patterned on the panels, and the timing controllers 1321 and 1331 and the data driving units 1322 and 1332 may be provided in various forms such as COG (Chip on Glass), COF (Chip on Film), PCB, and FPCB (Flexible Circuit Board).

The processing unit 1310 provides image data to the transparent-display-unit timing controller 1321 and light control data to the light-control-unit timing controller 1331. The light control data may be data for selectively controlling the transmittance of incident light. The processing unit 1310 may generate a synchronization signal and provide the generated synchronization signal to the transparent-display-unit timing controller 1321 and the light-control-unit timing controller 1331 so as to allow the transparent display panel and the light control unit to be time-synchronized. The synchronization signal may be generated to be synchronized to a panel having a slow response speed of the transparent display panel and the light control unit.

The transparent display panel includes the transparent-display-unit timing controller 1321, the transparent-display-unit panel 1320, the transparent-display-unit data driving unit 1322, the transparent-display-unit scan driving unit 1323, and a power supply unit 1324.

The transparent-display-unit timing controller 1321 may be referred to as a transparent-display-unit driving unit, and the transparent-display-unit driving unit generates a scan control signal based on the image to control the transparent-display-unit scan driving unit 1323, and generates a data signal to control the transparent-display-unit data driving unit 1322.

The transparent-display-unit data driving unit 1322 receives the data signal from the transparent-display-unit timing controller 1321. The transparent-display-unit data driving unit 1322 converts the data signal into the corresponding gamma voltage, and determines the amount of current flowing in the anode and the cathode of the organic light-emitting element to control emission of the corresponding pixel.

The transparent-display-unit scan driving unit 1323 is operated such that scan lines are driven and the data signal is inputted to pixels corresponding to the scan lines. The transparent-display-unit scan driving unit 1323 may provide one scan line signal or a plurality of scan line signals for selecting one scan line or a plurality of scan lines to the transparent-display-unit panel 1320.

The power supply unit 1324 supplies various voltages required in the transparent-display-unit data driving unit 1322, the transparent-display-unit scan driving unit 1323 and the anode and the cathode of the transparent-display-unit panel 1320. The power supply unit 1324 supplies ELVDD, ELVSS, VDD, and VSS. The transparent-display-unit panel 1320 includes a plurality of scan lines, a plurality of data lines, and a plurality of transparent-display-unit pixels.

In order to allow the organic light-emitting layer to emit light according to image information of the input data signal, a switching thin-film transistor T1 and a driving thin-film transistor T2 are used.

Driving of the light control unit in the transparent display device 1300 according to the exemplary embodiment of the present invention will be described. The light control unit may be configured and driven in a passive matrix. Alternatively, the light control unit may be driven in an active matrix. The light-control-unit timing controller 1331 receives the light control data from the processing unit 1310 as mentioned above. The light control data are data for controlling the transmittance of the transparent display device 1300. The light control data are determined by the processing unit 1310 or the light-control-unit timing controller 1331 of the transparent display device 1300.

The light-control-unit scan driving unit 1333 is operated such that the scan lines are driven and the data signal is inputted to the pixels corresponding to the scan lines. The light-control-unit data driving unit 1332 converts the data signal into the corresponding voltage, and supplies the voltage and pulse to the light control unit to control the spread of the black charged particles. In other words, the transparent display device 1300 adjusts the voltage or pulse applied to the light control unit by using the light control data, so that the transmittance of the light control unit can be adjusted.

The power supply unit supplies the voltages required in the light-control-unit data driving unit 1332 and the light-control-unit scan driving unit 1333.

When the scan control signal is applied from a scan wiring, a switching thin-film transistor T3 transmits the light control data signal from the data line to the electrode of the light control unit to control the voltage applied to the electrode, and the movement of the black charged particles dispersed in the fluid is controlled by the applied voltage.

Figure 14:
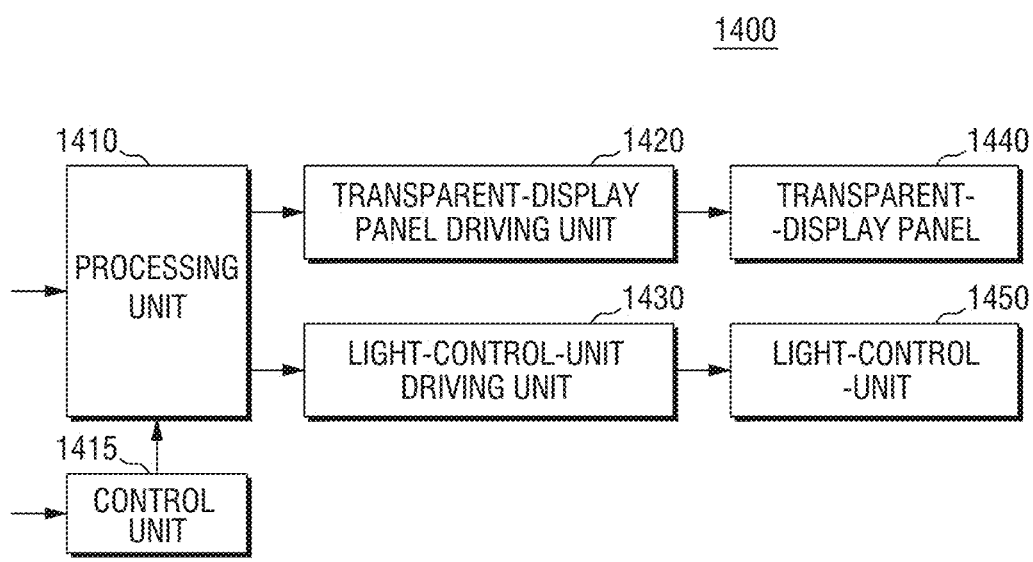
FIG. 14 is a block diagram of a transparent display device according to an exemplary embodiment of the present invention.

FIG. 14 is a block diagram of a transparent display device according to an exemplary embodiment of the present invention. A transparent display device 1400 includes a processing unit 1410, a controller 1415, a transparent display panel, and a light control unit. The transparent display panel includes a transparent-display-unit panel 1440 and a transparent-display-unit panel driving unit 1420, and the light control unit includes a light-control-unit panel 1450 and a light-control-unit panel driving unit 1430. The transparent-display-unit panel 1440 and the light-control-unit panel 1450 include a plurality of pixels.

The controller 1415 controls an operation of a system of the transparent display device 1400. The controller 1415 may operate the system in response to a command of the user, and operates the system according to a preset operation. For example, the controller 1415 controls the processing unit 1410 to decrease the transmittance based on light characteristics from an optical sensor so as to improve the visibility of an image displayed on the transparent display device 1400 and to operate various modes of the transparent display device 1400.

The controller 1415 may include the processing unit 1410 or may be integrated with the processing unit 1410. The controller 1415 of the transparent display device 1400 includes the system. The system includes an OS (Operating System). The OS further includes various modes for providing effects of the present invention to the user. The modes are selected by the user when necessary, and, especially, a third mode is actively adapted to the ambient environment to be selected as an optimum mode.

A first mode sets the light control unit to a see-through state. The first mode maximizes a transparent effect, but cannot solve a problem about the visibility of an external environment.

A second mode sets the light control unit to a shield state. The second mode maximizes a shield effect. The visibility is enhanced as much as possible in the second mode. However, there is a problem that since the see-through area of the entire screen is shielded, a transparent display effect is not exhibited.

The third mode is a mode for extracting an object of an input image and adjusting the transmittance of a light control unit region corresponding to the object displayed on the transparent display panel. The transparent display device 1400 in the third mode minimizes a decrease in visibility with a change in an external brightness and the external environment. In the third mode, the visibility of the input image is maintained while maintaining the transparent effect.

A fourth mode is a light control mode, and the fourth mode displays the image at a resolution of the light control unit. By blocking the power supply of the organic light-emitting device, the organic light-emitting device is driven at low power. The fourth mode is specialized under the outdoor environment and is effective when the external light is considerably bright. In the fourth mode, the image is realized by the shielding. The fourth mode may be selected by the user, for example, in the environment of very high brightness or may be operated by setting a fourth mode entering reference brightness.

The operations of the controller 1415 are selected through an input unit on the system. For example, the transparent display device 1400 includes the input unit, and the plurality of modes may be sequentially changed whenever input signals are input through the input unit. Such a physical input unit can be effectively used when the visibility of the transparent display device 1400 is rapidly decreased. When the visibility is rapidly decreased, since it is difficult for the user to see menus displayed on the transparent display panel, it may be difficult to select a mode that the user needs.

Figure 15:
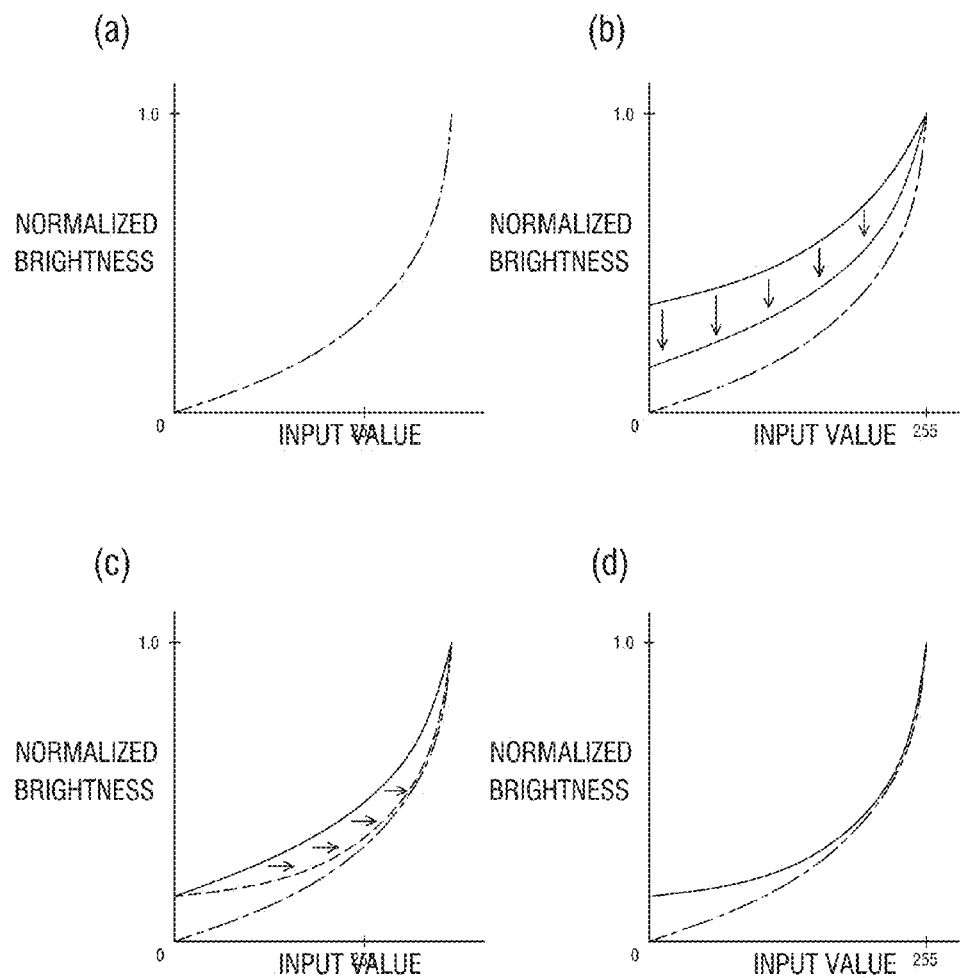
FIG. 15 is a conceptual diagram of a gamma curve of a transparent display device according to an exemplary embodiment of the present invention.

FIG. 15 is a conceptual diagram of a gamma curve of a transparent display device according to an exemplary embodiment of the present invention.

In graphs of (a) and (d) of FIG. 15, an x-axis indicates input values of 0 to 255, and is an axis indicating values from the darkest input value to the brightest input value of an image. A y-axis is an axis indicating luminance represented as a normalized value of 0 to 1.0. A gamma curve will be assumed and described as a gray gamma curve.

(a) of FIG. 15 illustrates a graph of a gamma curve when a light control unit of a transparent display device according to an exemplary embodiment of the present invention controls a light transmittance to 0% and an external light of 200 lux is incident into a back surface of the transparent display device. A gamma value in the gamma curve illustrated in (a) of FIG. 15 may be 2.2. Hereinafter, the gamma curve expressed by an alternate long and short dash line in (a) of FIG. 15 will be referred to as a target gamma curve. When light incident into the back surface of the transparent display device is 100% shielded, a gamma curve having a gamma value of 2.2 in an image can be measured without being distorted. In order to drive the transparent display device such that an object on the back surface of the transparent display device can be seen, the light incident into the back surface may pass through the transparent display device.

In (b) of FIG. 15, a solid line illustrates a gamma curve expected under a 200 lux external incident light having a light transmittance of 100%. An alternate long and short dash line is the target gamma curve as illustrated in FIG. 15(*a*). A dotted line is the same gamma curve as the solid line except a light transmittance of 40%.

Hereinafter, the light incident into the back surface of the transparent display device will be referred to and treated as a noise, and added to the brightness of each input value. Therefore, the solid gamma curve is changed overall so as to increase the minimum luminance. Since the minimum luminance is increased by the noise, the visibility for black is decreased. Since a difference between the minimum luminance and the maximum luminance is decreased, a contrast ratio may be decreased.

In the solid gamma curve in (b) of FIG. 15, if the noise is reduced by controlling a light transmittance of the transparent display device to 0% by the light control unit, the solid gamma curve may be identical to the gamma curve in (a) of FIG. 15 again. However, when the light transmittance is close to 0%, the object on the back surface of the transparent display device cannot be seen as described above.

In the transparent display device according to the exemplary embodiment of the present invention, since the light control unit controls the light transmittance and the gamma curve is modified by performing image processing to the displayed image, the visibility for black in the transparent display device and additional informativeness that enables the object on the back surface to be seen can be maintained at the same time.

If the light transmittance of the transparent display device is controlled to 40% under the condition of the solid line illustrated in (b) of FIG. 15, a dotted gamma curve may be generated. The dotted gamma curve is closer to the target gamma curve expressed by the alternate long and short dash line than the solid gamma curve. However, the dotted gamma curve has the higher luminance than the target gamma curve expressed by the alternate long and short dash line in the entire range of x-axis input values.

The displayed image may be processed to increase a luminance value of the image in order to lower the gamma curve to the dotted gamma curve illustrated in (b) of FIG. 15 and improve a contrast ratio. That is, if a luminance value of the image is increased, the luminance of the image is relatively increased as compared with the incident noise. Thus, the image can be more clearly seen and the contrast ratio and the visibility can also be improved. Therefore, the dotted gamma curve in FIG. 15(b) may be realized by increasing the luminance of the image while reducing the noise by the light control unit.

Further, in order to adjust the gamma curve so as to be close to the target gamma curve without decreasing the light transmittance, the gamma curve may be horizontally shifted.

In (c) of FIG. 15, a solid line illustrates a gamma curve expected under a 200 lux external incident light having a light transmittance of 40%. An alternate long and short dash line is the target gamma curve as illustrated in FIG. 15(a). A dotted gamma curve is a gamma curve expected when an image is adjusted under the condition of the solid line. The adjustment of the image may be adjustment of a gamma value. Herein, the adjustment of a gamma value may refer to a change of a gamma value from 2.2 to, for example, 2.8 in the solid gamma curve function illustrated in FIG. 15(c).

If an image displayed by the transparent display device is adjusted under the condition of the solid line illustrated in (c) of FIG. 15, a dotted gamma curve may be generated. The dotted gamma curve may be closer to the target gamma curve expressed by the alternate long and short dash line than the solid gamma curve.

In (d) of FIG. 15, a solid line illustrates a gamma curve expected under conditions of a light transmittance of 40%, image adjustment, and a 200 lux external incident light. An alternate long and short dash line is the target gamma curve as illustrated in FIG. 15(a). When a light transmittance is controlled and an image is adjusted, the solid gamma curve has the higher luminance than the target gamma curve in some input values, i.e., in a low input value range, but has substantially the same luminance as the target gamma curve at a predetermined input value or higher.

The transparent display device according to the exemplary embodiment of the present invention adjusts a light transmittance and adjusts an image and thus enables an object on the back surface to be seen and also improves the visibility for black in the image.

Figure 16A:
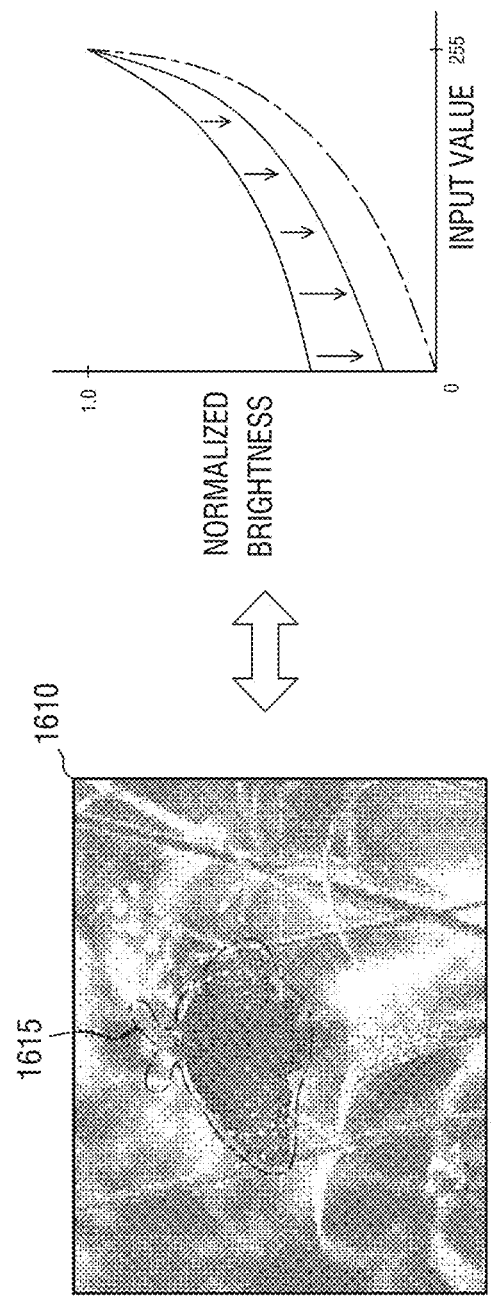
FIG. 16A, FIG. 16B, and FIG. 16C are conceptual diagrams illustrating images displayed by a transparent display device according to an exemplary embodiment of the present invention.
Figure 16B:
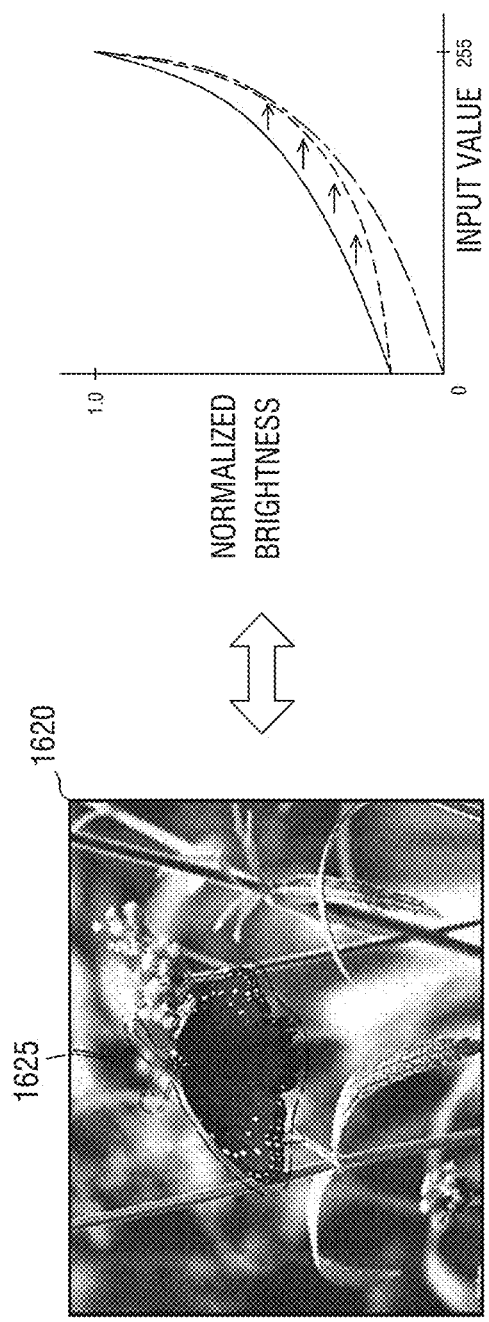
Figure 16C:
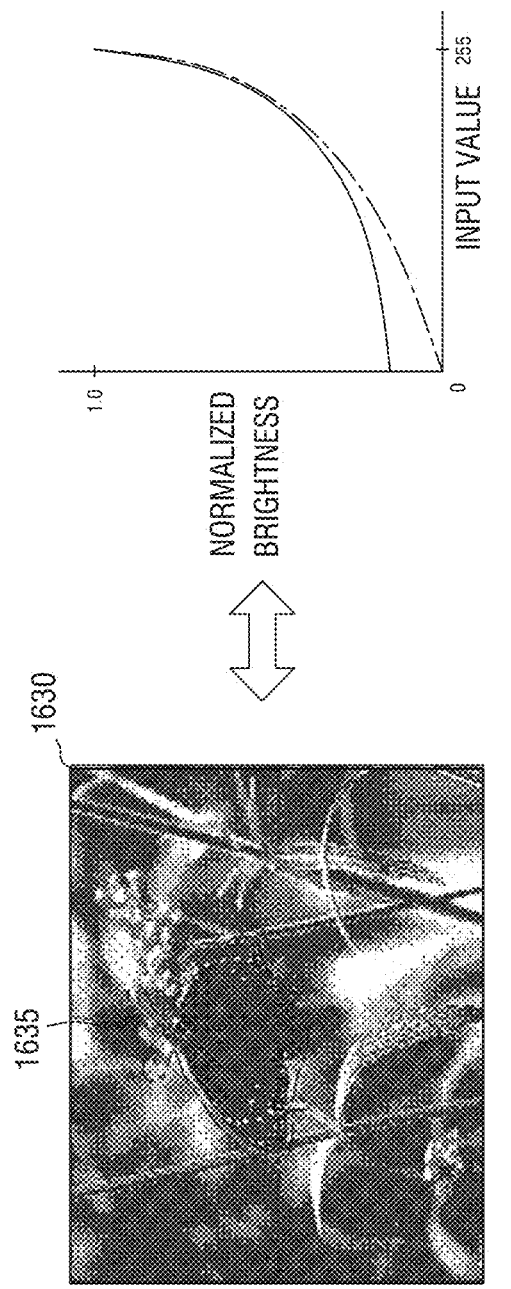

FIG. 16A, FIG. 16B, and FIG. 16C are conceptual diagrams illustrating images displayed by a transparent display device according to an exemplary embodiment of the present invention.

Referring to FIG. 16A, a displayed image 1610 provided on the left displays an object 1615. The displayed image 1610 has characteristics of a solid gamma curve provided on the right. The solid gamma curve on the right may be substantially the same gamma curve as the solid gamma curve illustrated in FIG. 15(b). The displayed image 1610 on the left and the solid gamma curve are an image and a gamma curve when a noise incident into a back surface of a transparent display device is applied. Due to the noise incident into the back surface of the transparent display device, the displayed image 1610 generally has a low contrast ratio and a low visibility for black.

Referring to FIG. 16B, a displayed image 1620 provided on the left displays an object 1625. The displayed image 1620 has characteristics of a solid gamma curve provided on the right. The solid gamma curve on the right may be substantially the same gamma curve as the solid gamma curve illustrated in FIG. 15(c). The displayed image 1620 on the left and the solid gamma curve are an image and a gamma curve when only 40% of a noise incident into a back surface of a transparent display device is allowed to be incident under the control of a light control unit. Due to a decrease in the light transmittance, the gamma curve of the displayed image 1620 is generally lowered and generally has an improved contrast ratio and an improved visibility for black.

As described above, since the displayed image is processed to increase a luminance value of the image in order to improve a contrast ratio as described above, the gamma curve can be lowered.

Referring to FIG. 16C, a displayed image 1630 provided on the left displays an object 1635. The displayed image 1630 has characteristics of a solid gamma curve provided on the right. The solid gamma curve on the right may be substantially the same gamma curve as the solid gamma curve illustrated in FIG. 15(d). The displayed image 1630 on the left and the solid gamma curve are an image and a gamma curve when only 40% of a noise incident into a back surface of a transparent display device is allowed to be incident under the control of a light control unit and a gamma value is adjusted. As compared with the displayed image 1620 illustrated in FIG. 16B, the color black of the object 1635 or a dark region on the left in the displayed image 1630 of FIG. 16C are more clearly expressed, but bright regions on the right and on the bottom are maintained. Therefore, a contrast ratio and a visibility for black are relatively improved.

In the transparent display device according to the exemplary embodiment of the present invention, adjustment of a light transmittance is complementary to adjustment of an image. By performing both processes, the transparent display device improved in both of informativeness that enables an object on the back surface to be seen and visibility for black can be realized.

Figure 17:
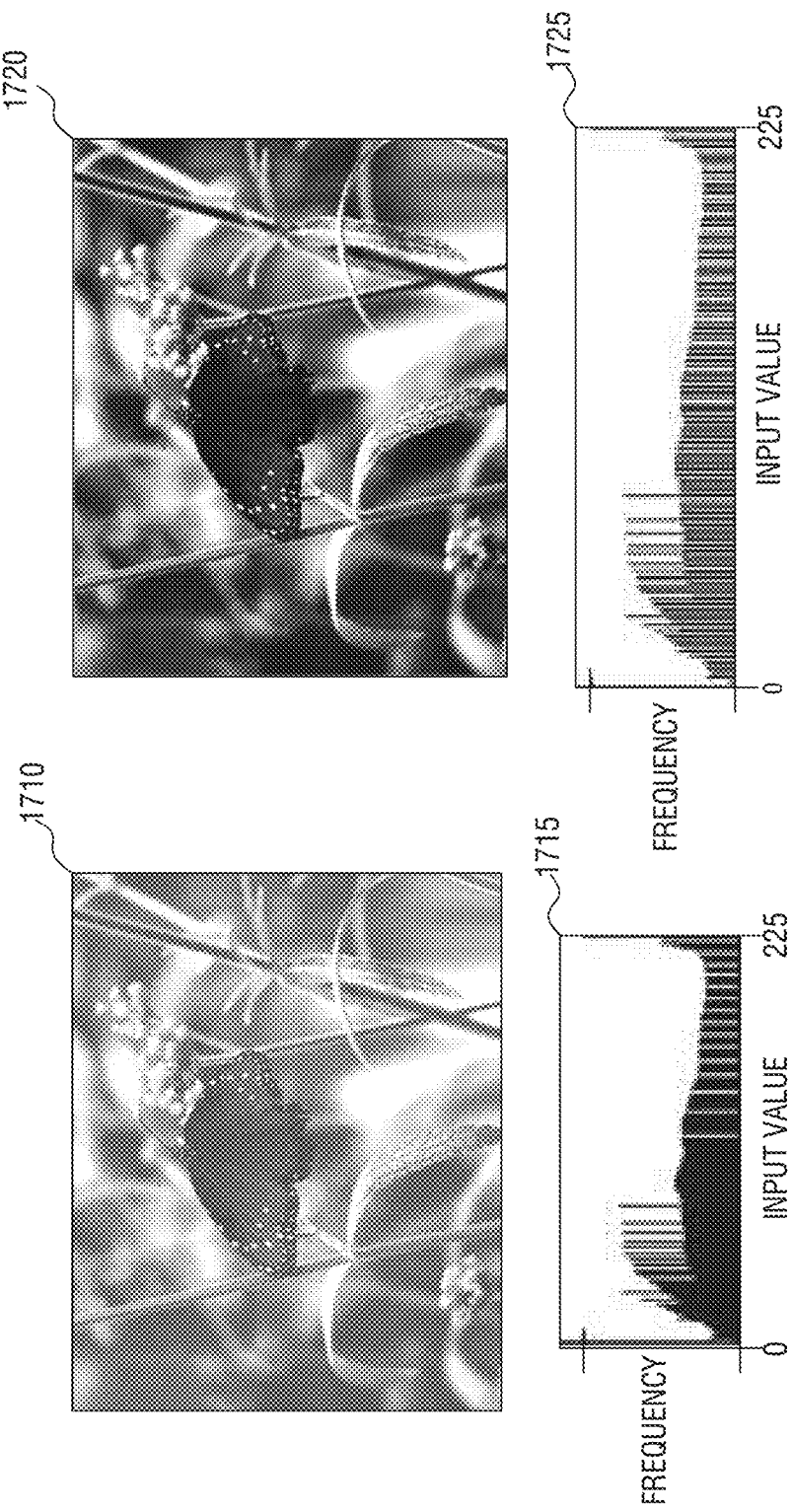
FIG. 17 illustrates conceptual diagrams for histogram analysis of images according to an exemplary embodiment of the present invention.

FIG. 17 illustrates conceptual diagrams for histogram analysis of images according to an exemplary embodiment of the present invention.

Referring to FIG. 17, images 1710 and 1720 in (a) and (b) of FIG. 17 are input from a RAM or the like. That is, the images 1710 and 1720 in (a) and (b) of FIG. 17 are not images displayed by a transparent display device but original image data, and the histograms in FIG. 17(a) and FIG. 17(b) are histograms about the input image data. In the histograms, an x-axis indicates input values of 0 to 255, and is an axis indicating values from the darkest input value to the brightest input value of an image. A y-axis is an axis indicating a frequency of a pixel for each input value.

Referring to the histogram 1715 in (a) of FIG. 17, a frequency of a pixel is low at a low input value of the image 1710. Therefore, the image 1710 in (a) of FIG. 17 may be an image generally having a low contrast ratio and a low frequency of black.

The transparent display device according to the exemplary embodiment of the present invention analyzes the histogram 1715 illustrated in (a) of FIG. 17, detects a low frequency at a low input value, and shifts or stretches the histogram 1715.

The image in (b) of FIG. 17 is an image 1720 which has an increased frequency of a pixel at a low input value since a histogram 1725 is stretched. Referring to the histogram 1725 in (b) of FIG. 17, a frequency of a pixel at a low input value is increased, and referring to the image 1720 in (b) of FIG. 17, the color black is more clearly displayed.

A processing unit of a transparent display control device according to an exemplary embodiment of the present invention may process an image such that a display of the color black in a transparent display device can be improved in a transparent display device, since the brightness of the overall image is increased. Therefore, if an image displayed by the transparent display device is darker than an image displayed by an opaque display apparatus, visibility may be improved.

Since an input image may be generated or distributed without considering a transparent display device, the transparent display control device according to the exemplary embodiment of the present invention may process the image so as to be more suitable for the transparent display device. Although FIG. 17 illustrates the process of stretching the histogram 1725, various digital signal processing methods such as histogram shifting, and enhanced level adjusting may be applied.

A transparent display device according to another exemplary embodiment of the present invention may include a transparent display panel, at least one optical sensor configured to measure color of an external light incident into a back surface of the transparent display panel, a light control unit configured to control an amount of light transmitted through the plurality of see-through portions, and a controller configured to adjust a transmittance of the light control unit and an image on the transparent display panel based on characteristics of light.

That is, the optimization in image quality for an external environment and the improvement in visibility provided by the adjustment of the image on the transparent display panel based on color of the external light can be further enhanced by adjusting an amount of the external light incident into the back surface of the transparent display device by the light control unit.

Figure 18:
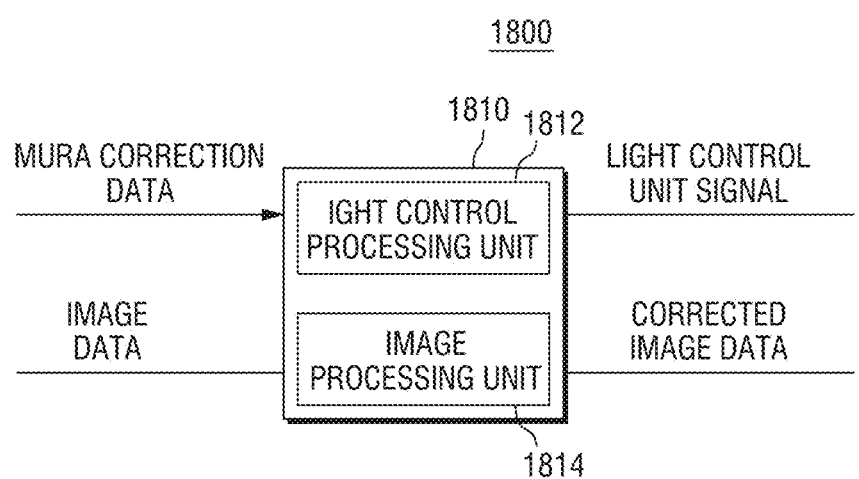
FIG. 18 is a block diagram illustrating a light transmittance control device according to an exemplary embodiment of the present invention.

FIG. 18 is a block diagram illustrating a transparent display control device according to an exemplary embodiment of the present invention.

A transparent display control device 1800 according to the exemplary embodiment of the present invention includes a processing unit 1810 including a light control processing unit 1812 and an image processing unit 1814. The transparent display control device 1800 receives mura correction data and image data already stored in a memory, corrects mura of the light control unit, corrects the received image, and generates a light control unit signal and a corrected image signal.

The memory stores information for correcting mura of an image displayed by the light control unit. As the memory in which the mura correction data are stored, a memory capable of storing information even when the transparent display device is turned off may be used. The memory may be, for example, an EEPROM memory capable of being electrically rewritten.

The mura correction data are information for correcting mura of an image displayed on a panel of the light control unit and the mura may appear during a process of the light control unit. The image data are image information having digital values and including the contents of an image by unit of frame.

The processing unit 1810 is configured to receive the image data, the mura correction data, and the like, and perform various kinds of signal processing to the image signal and the light control unit signal input to control the transparent display panel and the light control unit, respectively. Further, the image processing unit 1814 of the processing unit 1810 may adjust the image signal and transmit the adjusted image signal to the transparent display panel. The light control processing unit 1812 of the processing unit 1810 may generate the light control unit signal and transmit the generated light control unit signal to the light control unit. The image processing performed by the processing unit 1810 may include, for example, adjustment of a gain used for adjusting the luminance of an image displayed by the transparent display panel, adjustment of an image based on a histogram of the image, modification of a gamma curve by modifying image data, and correction of mura by the light control unit.

The light control processing unit 1812 may adjust the light control unit signal so as to correct mura of the light control unit. The light control processing unit 1812 can suppress unique mura on the panel of the light control unit by adjusting a level of the light control unit signal based on the mura correction data. The light control processing unit 1812 may adjust the light control unit signal based on the mura correction data by unit of data input for each clock cycle.

The image processing unit 1814 performs image processing to the image data. A luminance level may be detected from the input image data. The luminance level of the image data may be, for example, histogram data. The image processing unit 1814 may extract histogram data of each frame from the image data.

The histogram data are data written by dividing a scope where image data are present by, for example, 256 luminance sections and detecting an appearance frequency of data in each section.

The image processing unit 1814 may perform various kinds of image processing based on the histogram data. The image processing unit 1814 may adjust a picture level in the histogram data in order to minimize a burn-in phenomenon of an image in the transparent display panel or reduce power consumption. For example, the image processing unit 1814 detects a minimum picture level, a maximum picture level, or an average picture level (APL) by analyzing the histogram, and adjusts the picture level based on the detected picture level, thereby adjusting the luminance of an image displayed on the transparent display panel.

The image processing unit 1814 of the transparent display control device 1800 according to the exemplary embodiment of the present invention may perform image processing in order to improve a display of the color black in the transparent display device. The image processing for improving a display of the color black may include image processing for adjusting an image by analyzing histogram data, image processing for adjusting a gamma curve based on histogram data, and the like. In the present specification, when the transparent display control device 1800 according to the exemplary embodiment of the present invention performs the image processing for improving a display of the color black, histogram shifting, histogram stretching, and gamma curve adjustment will be exemplified, but the present invention is not limited thereto. The transparent display control device 1800 may perform the image processing for improving a display of the color black by various kinds of image processing. The image processing unit 1814 may analyze a histogram distribution range of each frame from the histogram data. The image processing unit 1814 may perform a process such that the transparent display panel can more clearly display a black image based on a result of the analysis.

In the transparent display device, light is incident into a back surface, and, thus, the displayed black may be substantially brighter than the color black. Further, in addition to the color black, the displayed brightness in the entire image is increased. Therefore, an image displayed on a transparent display device may have a lower contrast ratio than an image displayed on an opaque display apparatus. An input image may be generated or distributed without considering a transparent display device, and it may be important to process an image displayed on a transparent display device so as to have a higher contrast ratio than an image displayed on a non-transparent display device. Therefore, the transparent display control device 1800 according to the exemplary embodiment of the present invention may perform image processing to an image so as to be more suitable for the transparent display device.

The image processing to an image so as to be more suitable for the transparent display device may include a process to an image so as to display more regions having a low picture level, i.e., more dark regions. An image has a different distribution of dark regions for each frame, and, thus, the image may be processed by unit of frame, or the uniform image processing may be performed to all frames, so that the distribution of dark regions can be increased on average.

For example, the image processing unit 1814 according to the exemplary embodiment of the present invention may measure a frequency of a picture level in a predetermined section from a histogram of an image. For example, if a frequency of a low picture level is low in a predetermined section, the image processing unit 1814 may process the image so as to shift the histogram. That is, the image processing unit 1814 may perform stretching such that pixels of the image of a high picture level include a predetermined section of a low picture level. If the transparent display device displays an image-processed image, the image in which the color black is more clearly displayed can be seen.

The transparent display control device 1800 may adjust a gamma curve of an image in order to improve a display of the color black. There may be various methods for improving a display of the color black by adjusting a gamma curve of an image. The following is a gamma curve function.

$$L(V)=L_{max}(\alpha V+\varepsilon)^{\gamma}$$

In the gamma curve function, L(V) represents an output luminance, V represents an input signal, $\alpha$ represents a gain, $\varepsilon$ represents an offset, and $\gamma$ represents a gamma value. The transparent display control device 1800 may improve a display of the color black in the transparent display device by modifying at least one of $\alpha$, $\varepsilon$, and $\gamma$. The image processing unit 1814 of the transparent display control device 1800 can adjust a contrast ratio by adjusting $\alpha$, adjust brightness by adjusting the offset $\varepsilon$, and adjust a gamma through data adjustment of an input image by adjusting $\gamma$.

In the transparent display control device 1800 according to the exemplary embodiment of the present invention, the image processing to an image so as to be more suitable for the transparent display device is based on a control of a light transmittance by the light control unit. As described above, the light control unit of the transparent display device can shield at least a part of light incident into a back surface of the transparent display device. If a part of the incident light is shielded, a display of the color black and a contrast ratio in an image displayed on the transparent display device may be improved.

Therefore, the image processing to an input image by the image processing unit 1814 of the transparent display control device 1800 may be based on a light transmittance of the light control unit. By way of example, if a light transmittance of the light control unit is set to 40%, a greater amount of light is shielded, as compared with a case where a light transmittance is 100%. Therefore, the intensity of the image processing to an image may be low, as compared with a case where a light transmittance is 100%, so as to minimize distortion of the image. That is, if a light transmittance of the light control unit is low, adjustment of an image may be limited so as to minimize distortion of the image.

According to another exemplary embodiment of the present invention, the light control processing unit 1812 of the transparent display controller 1800 may determine a transmittance of the light control unit based on an image-processed image. For example, the light control processing unit 1812 of the transparent display controller 1800 determines a case where an image is processed so as to be suitable for the transparent display device but a sufficient visibility cannot be obtained, and then controls a transmittance of the light control unit in addition to the image processing. Otherwise, the light control processing unit 1812 may adjust a transmittance of a light shielding unit to be equal to or lower than a preset transmittance. The preset transmittance means a target transmittance.

That is, a transmittance of the light shielding unit may be determined and then an image may be image-processed based on the determined transmittance, or an image may be image-processed and then a transmittance of the light shielding unit may be determined based on the image-processed image.

In the transparent display control device 1800 according to the exemplary embodiment of the present invention, image processing may be complementary to a control of a transmittance of the light control unit. If noises having an equivalent level are incident into the back surface of the transparent display device, it is difficult to lower a minimum picture level by image processing. That is, in the image data, a value of black which can be displayed is determined as 0 in the range of 0 to 255, and, thus, after the image processing, the image may have a generally lower picture level or a higher contrast ratio, but an effect of the incident light cannot be reduced. Meanwhile, since the light control processing unit 1812 can adjust the incident light by decreasing or increasing a transmittance of the light control unit, the light control processing unit 1812 can directly improve the visibility for black.

The transparent display controller 1800 according to the exemplary embodiment of the present invention generates image-processed image data and light control data based on a transmittance of the light control unit according to the above-described image processing method. The generated image-processed image data may be transmitted to the transparent display panel and the generated light control data may be transmitted to the light control unit.

Figure 19A:
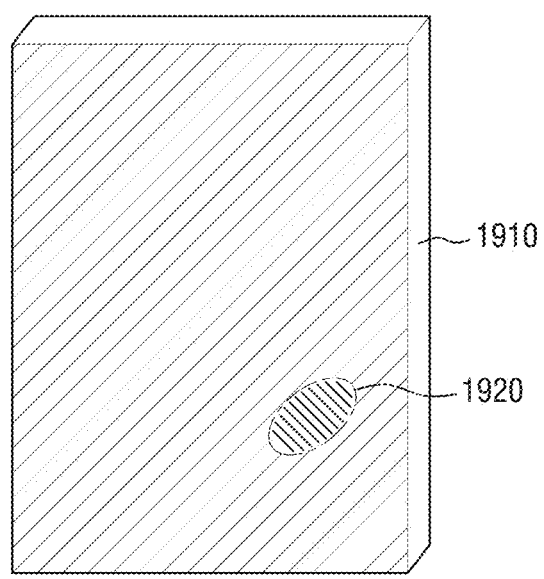
FIG. 19A and FIG. 19B are conceptual diagrams illustrating mura correction by a light control unit of a transparent display device according to an exemplary embodiment of the present invention.
Figure 19B:
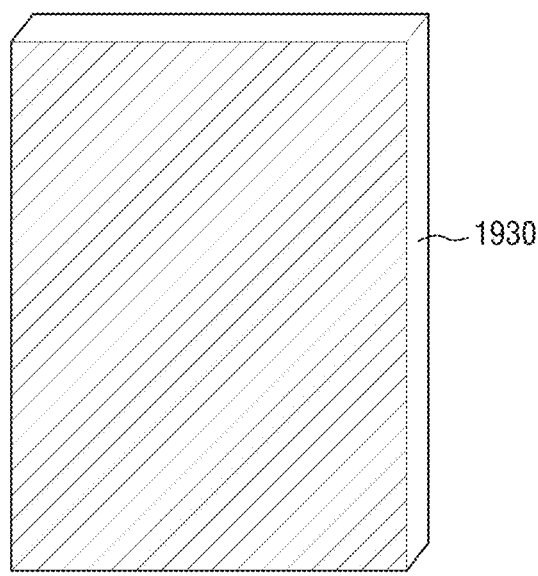

FIG. 19A and FIG. 19B are conceptual diagrams illustrating mura correction by a light control unit of a transparent display device according to an exemplary embodiment of the present invention.

Referring to FIG. 19A, a transparent display device 1900 includes a light control unit 1910, and a mura 1920 is illustrated on one surface of the light control unit 1910. The mura 1920 may be reduced by improving a manufacturing process of the light control unit 1910, or the mura 1920 may be compensated for by correcting data for driving the light control unit 1910.

The mura 1920 may result from a threshold voltage deviation of a driving thin film transistor of the light control unit 1910. Further, the mura 1920 may result from an exposure deviation caused by an overlapped exposure of an exposure device used for forming a thin film pattern during a manufacturing process of the light control unit 1910 and aberration of multilenses. The exposure deviation causes a change in width of the thin film pattern, thereby generating a parasitic capacitance deviation of the thin film transistor, a height deviation of a column spacer for maintain a cell gap, a parasitic capacitance deviation between data lines, and the like. Such deviations may cause a deviation of electric field in the light control unit 1910, resulting in a typical mura having a vertical or horizontal line shape. Furthermore, the mura 1920 may be displayed not only as the typical mura but also as an irregular and atypical mura due to a process defect such as an inflow of foreign materials.

The mura 1920 of the light control unit 1910 may be corrected in order to control a light transmittance to be uniform in the transparent display device 1900. Even in a general display apparatus, correction of uneven light emission has been performed. The correction of mura of the light control unit 1910 in the transparent display device 1900 may be more important. In the transparent display device 1900 according to the exemplary embodiment of the present invention, the transparent display panel and the light control unit 1910 are provided so as to face each other. That is, in the transparent display device 1900, the two display units are provided, and the user can see lights emitted or controlled by the two display units at the same time. Thus, the mura 1920 of the light control unit 1910 can be seen as the mura 1920 of the image displayed by the transparent display panel. Therefore, in a display apparatus including a plurality of panels such as the transparent display device 1900 according to the exemplary embodiment of the present invention, the uniformity of the panel is more important.

Hereinafter, mura correction data for correcting the uniformity of the light control unit 1910 will be described.

The mura correction data are information for correcting the mura 1920 of the image displayed on the panel of the light control unit 1910 and the mura may appear during a process of the light control unit 1910. In order to generate the mura correction data for the light control unit 1910, a process for extracting mura correction data for all regions of the light control unit 1910 may be needed. By directly designating a size or a level of a mura region, using an imaging camera, or measuring a threshold voltage of the driving thin film transistor, mura data may be extracted.

In order to detect whether or not the mura 1920 is present in a pixel of the light control unit 1910, a light source having a uniform luminance is disposed on one side of the transparent display device 1900 and an imaging unit is disposed on the other side of the transparent display device 1900. Since a voltage applied to each pixel of the light control unit 1910 has a linear relationship with a light transmittance in each pixel of the light control unit 1910, a luminance incident into the imaging unit may be changed in proportion to the applied voltage.

If the panel is applied with a voltage which enables the panel to have a predetermined light transmittance, a transmittance of the light control unit 1910 is controlled according to the applied voltage. The light source is disposed on one side of the controlled panel and the imaging unit is disposed on the other side thereof to capture an image of the other side surface of the panel. An input voltage for an image with respect to a mura region is acquired from the image captured by the imaging unit. By analyzing the acquired input voltage, the mura correction data can be obtained.

That is, the mura correction data are correction data for correcting an input voltage for a pixel that generates the mura 1920 in order to remove the mura 1920 from the panel of the light control unit 1910 when the mura 1920 is present in the image controlled in light transmittance by the light control unit 1910.

The mura correction data may be mura correction data for correcting uneven light emission generated in a horizontal direction or a vertical direction, or may be mura correction data for correcting a locally generated mura.

The mura correction data are stored in a memory of the transparent display device 1900. As described above, the memory in which the mura correction data are stored may be a memory capable of storing information even when the transparent display device 1900 is turned off. The memory may be, for example, an EEPROM memory or a flash memory capable of being electrically rewritten.

Referring to FIG. 19A, the transparent display device 1900 includes the light control unit 1910, and the mura 1920 is illustrated on one surface of the light control unit 1910. The transparent display control device removes the mura 1920 by correcting the light control data input to the light control unit 1910 by using the above-described mura correction data. FIG. 19B illustrates a light control unit 1930 of the transparent display device 1900 controlled by using mura-corrected light control data. The light control unit 1930 of the transparent display device 1900 according to the exemplary embodiment of the present invention corrects a mura, so that a control of a light transmittance of the transparent display device 1900 can be performed in a more uniform manner.

Figure 20:
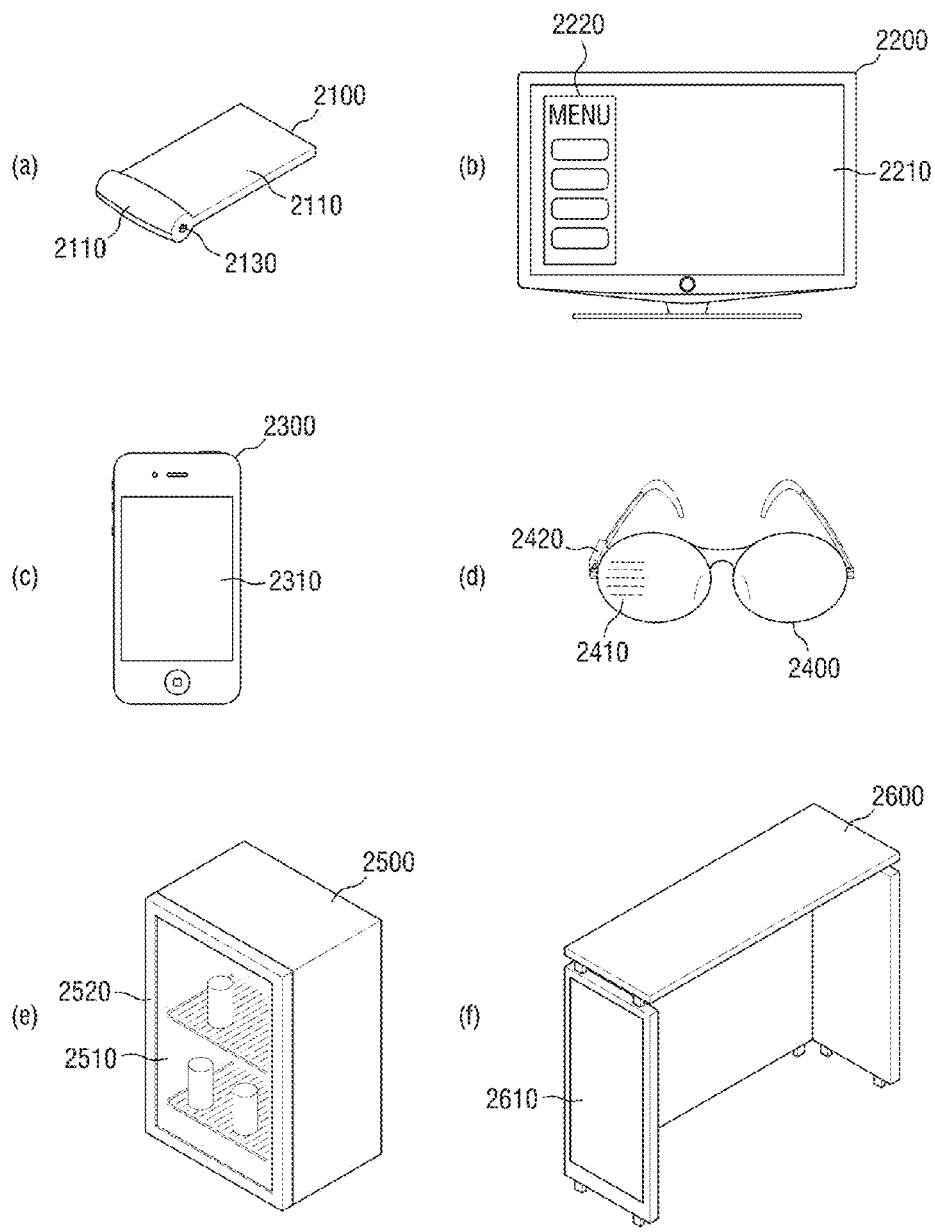
FIG. 20 shows schematic diagrams of apparatuses to which the transparent display device according to the exemplary embodiment of the present invention is applicable.

FIG. 20 illustrates schematic diagrams of devices to which a transparent display device according to an exemplary embodiment of the present invention can be applied.

(a) of FIG. 20 illustrates a case where the transparent display device according to the various exemplary embodiments of the present invention is attached to a transparent device 3100. The transparent device 3100 may include a transparent display device 3110, a controller 3120, and an input unit 3130. The transparent display device 3110 may be formed such that no bezel is formed on at least one surface of the transparent display device 3110 or the minimum number of bezels is formed on the at least one surface thereof. The transparent device 3100 may include an application for utilizing an augmented reality function through the transparent display device 3110 or other functions of the transparent display device 3110 by the controller 3120. The transparent device 3100 may select various modes for controlling the transparent display device 3110 by using a separate input unit 3130 such as buttons. The modes for controlling the transparent display device 3110 may include a power saving mode, a cinema mode, an improved luminance mode, and the like. The separate input unit 3130 may be used when the visibility of the transparent display device 3110 is rapidly decreased by the ambient environment and it is difficult to select a control window displayed on the transparent display device 3110.

(b) of FIG. 20 illustrates a case where the transparent display device according to the various exemplary embodiments of the present invention is used as a transparent display device 3200 or a display apparatus of a screen. The transparent display device 3200 may be configured to recognize an image through the transparent display device 3210 and an object on a back surface of the transparent display device 3210.

The transparent display device 3200 may be configured to display a control window 3220 through which various modes for controlling the transparent display device 3210 can be selected. The modes for controlling the transparent display device 3210 may include a power saving mode, a cinema mode, an improved luminance mode, and the like. The user may appropriately select a mode for controlling the transparent display device 3210 and thus achieve a purpose of use of the transparent display device 3210.

(c) of FIG. 20 illustrates a case where the transparent display device according to the various exemplary embodiments of the present invention is used as a display apparatus of a transparent mobile device 3300. (c) of FIG. 20 illustrates that a transparent display device 3310 according to the various exemplary embodiments of the present invention is included in the transparent mobile device 3300, but the transparent display device 3310 may be provided at a small-sized device or a mobile device such as a smart phone, a cellular phone, a tablet PC, and a PDA. When the transparent display device 3310 is provided at the small-sized device, since a built-in battery is used without using an external power supply, the elements of the transparent display device 3310 may be designed to be suitable for the limited capacity of the battery. When the transparent display device 3310 is used as the display apparatus of the transparent mobile device 3300, the transparent display device 3310 may include a touch-screen for user input of the transparent mobile device 3300. The touch-screen may be formed on the transparent display device 3310, or may be formed in in-cell type. Further, since the back surface of the transparent display device 3310 can be recognized, the touch-screen may be configured to sense a touch of both sides of the transparent display device 3310.

(d) of FIG. 20 illustrates a case where the transparent display device according to the various exemplary embodiments of the present invention is used as a display apparatus of smart glasses 3400. The smart glasses 3400 include a transparent display device 3410 and a controller 3420. When the transparent display device 3410 according to the various exemplary embodiments of the present invention is used in the smart glasses 3400, the transparent display device 3410 may be cut off in a rectangular shape or an elliptical shape, and a wiring suitable for various shapes and a driving unit may be set in the transparent display device 3410. Moreover, since a viewing side of the user becomes close to the transparent display device 3410, an optical coating process may be appropriately performed on the transparent display device 3410, or a driving resolution of the image may be appropriately selected.

(e) of FIG. 20 illustrates a case where the transparent display device according to the various exemplary embodiments of the present invention is included in a refrigerator 3500. A transparent display device 3510 may be used as a part of a door 3520 of the refrigerator. When the transparent display device 3510 is used as the door 3520 of the refrigerator, the transparent display device 3510 may include a device that reflects energy. In addition, in order to easily see an object within the refrigerator 3500 on a back surface of the transparent display device 3510, a dehumidification coating process may be performed on the transparent display device 3510.

(f) of FIG. 20 illustrates a case where the transparent display device according to the various exemplary embodiments of the present invention is used as an advertisement displaying apparatus 3600 at a bus station. (f) of FIG. 20 illustrates that a transparent display device 3610 according to the various exemplary embodiments of the present invention is included in the advertisement displaying apparatus 3600 at a bus station, but the transparent display device 3610 may be provided at a fixation device or a large-sized device such as a television or a billboard. Since a power is supplied from an external power supply, the elements of the transparent display device 3610 may be designed so as to realize higher definition of the transparent display device 3610 due to a stabilized power supply. Further, the advertisement displaying apparatus 3600 at a bus station may include a motion sensor capable of interacting with pedestrians. For example, the motion sensor may include TOF (Time of Flight) infrared sensor.

When the transparent display device according to the various exemplary embodiments of the present invention is used as a smart window, the transparent display device may include a supporting member for using as at least the smart window, and the supporting member may include all kinds of films or membranes such as a film, a protection membrane, a protection film, and the like that can be used in the smart window. Moreover, a design of the transparent display device may be partially changed depending on a place in which the smart window is provided. For example, when the transparent display device is provided at a high-humidity place such as a toilet, a basin, a shower room, or a kitchen, the light control unit may be designed using moisture-resistance elements.

In addition, when the smart window is provided at a place that is easily exposed to external impact, such as an external wall of a building, a window glass of a building or a window glass of a vehicle, the transparent display device may be designed using elements that easily absorb impact or have impact resistance.

Further, when the transparent display device is used as the smart window, various optical films for reinforcing optical and/or physical characteristics may be attached to the transparent display device. A reflecting film, a diffusing film, a prism film, a lens-pattern composite film, a double brightness enhancement film, a non-reflecting coat film, an anti-ultraviolet film, or an anti-infrared film may be used to reinforce optical and/or physical characteristics. The smart window to which the transparent display device is attached depending on the reinforced characteristics may be used as a window for a vehicle, a smart door, a projection wall, a smart mirror, or the like.

The steps of a method or algorithm described in connection with the embodiments disclosed in the present specification may be embodied directly in hardware, in a software module, or in a combination of the two. The software module may reside in a RAM memory, a flash memory, a ROM memory, an EPROM memory, an EEPROM memory, a register, hard disk, a removable disk, a CD-ROM, or any other form of storage medium known in the art. An exemplary storage medium is coupled to a processor such that the processor can read information from, and write information to, the storage medium. Otherwise, the storage medium may be integrated with the processor. The processor and the storage medium may reside in an application-specific integrated circuit (ASIC). The ASIC may reside in a user terminal. Otherwise, the processor and the storage medium may reside as discrete components in a user terminal.

Hereinafter, various features of the transparent display device according to the present invention will be described.

According to another feature of the present invention, the controller is configured to change respective gamma curves for red, green, and blue based on the characteristics of light so as to change the image displayed by the plurality of pixels.

According to yet another feature of the present invention, the controller is configured to change each of the gamma curves so as to increase a maximum luminance of the image displayed by the plurality of pixels.

According to still another feature of the present invention, the controller is configured to control the light control unit so as to maintain the transmittance of the light control unit to be equal to or lower than a predetermined transmittance based on the characteristics of light.

According to still another feature of the present invention, the controller is configured to adjust the respective gamma curves for red, green, and blue to be close to target gamma curves.

According to still another feature of the present invention, the controller is configured to perform image processing to the image and determine the transmittance of the light control unit based on the image-processed image.

According to still another feature of the present invention, the controller is configured to determine the transmittance of the light control unit and perform image processing to the image based on the determined transmittance.

According to still another feature of the present invention, the controller is configured to adjust the image by analyzing a histogram of the image.

According to still another feature of the present invention, the at least one optical sensor is configured to measure a brightness of the light incident into the back surface of the transparent display panel.

According to still another feature of the present invention, the controller is configured to control the light control unit so as to selectively shield the light incident into the transparent display panel.

According to still another feature of the present invention, the controller is configured to correct the transmittance of the light control unit based on mura correction information.

Hereinafter, various features of the transparent display device according to the present invention will be described.

According to another feature of the present invention, the controller is configured to perform image processing to the image to be displayed by the plurality of pixels by comparing the color of the external light with a predetermined threshold value.

According to yet another feature of the present invention, when at least one color of the external light is equal to or higher than the predetermined threshold value, the controller is configured to decrease a brightness of a pixel of a color corresponding to the color of the external light.

According to another feature of the present invention, the controller is configured to increase a brightness of a pixel of at least one other color except the pixel decreased in brightness.

According to another feature of the present invention, the controller is configured to adjust a decrement in brightness value of each of the adjacent pixels so as to correspond to each other according to the color of the external light.

According to another feature of the present invention, the controller is configured to give a weighted value to each of the color of the external light and decrease the brightness values of the plurality of pixels.

According to another feature of the present invention, the controller is configured to adjust color distortion of the image by limiting a brightness of the image based on the color of the external light.

According to another feature of the present invention, when the color of the external light is higher than color of the image displayed by the plurality of pixels, the controller is configured to completely limit emission from a pixel of a color corresponding to the color of the external light.

According to another feature of the present invention, the transparent display device further includes a light control unit configured to control an amount of light incident into the back surface of the transparent display panel and transmitted through the plurality of see-through portions, and the controller is configured to adjust the transmittance of the light control unit based on the color.

The exemplary embodiments of the present invention have been described in more detail with reference to the accompanying drawings, but the present invention is not limited to the exemplary embodiments. It will be apparent to those skilled in the art that various modifications can be made without departing from the technical sprit of the invention. Accordingly, the exemplary embodiments disclosed in the present invention are used not to limit but to describe the technical spirit of the present invention, and the technical spirit of the present invention is not limited to the exemplary embodiments. The protection scope of the present invention must be interpreted by the appended claims and it should be interpreted that all technical spirits within a scope equivalent thereto are included in the appended claims of the present invention.

What is claimed is:

1. A transparent display device, comprising:
   a transparent display panel including a plurality of pixels configured to display an image and a plurality of see-through portions disposed to be adjacent to the plurality of pixels;
   at least one optical sensor configured to measure color values of an external light incident into a back surface of the transparent display panel; and
   a controller configured to adjust the image on the transparent display panel based on the color values of the external light,
   wherein the controller is configured to adjust color distortion of the image by limiting a brightness of the image based on the color values of the external light and completely limit emission of the plurality of pixels corresponding to at least one color value of the external light when the at least one color value of the external light is higher than a corresponding color value of the image displayed by the plurality of pixels, and
   wherein the controller is configured to adjust at least a gamma value of a gamma curve function for processing the image based on the color values of the incident light.

2. The transparent display device of claim 1, wherein the controller is configured to perform image processing of the image to be displayed by the plurality of pixels by comparing the color values of the external light with a predetermined threshold value.

3. The transparent display device of claim 2, wherein when the at least one color value of the external light is equal to or higher than the predetermined threshold value, the controller is further configured to decrease brightness of the plurality of pixels whose color corresponds to the color value of the external light.

4. The transparent display device of claim 3, wherein the controller is further configured to increase brightness of at least one of the plurality of pixels other than the pixels whose brightness is decreased.

5. The transparent display device of claim 1, wherein the controller is further configured to correspondingly adjust a degree of decrement for brightness values for each of the plurality of pixels adjacent to each other according to the color values of the external light.

6. The transparent display device of claim 5, wherein the controller is further configured to apply a weighted value to each of the color values of the external light and decrease the brightness values of the plurality of pixels based on the weighted color values of the external light.

7. The transparent display device of claim 1, further comprising:
a light control unit configured to control an amount of light that passes through the plurality of see-through portions, wherein the light being incident into the back surface of the transparent display panel,
wherein the controller is configured to adjust the transmittance of the light control unit based on the color values.

8. A transparent display device, comprising:
a transparent display panel including a plurality of pixels configured to display an image and a plurality of see-through portions disposed to be adjacent to the plurality of pixels;
at least one optical sensor configured to measure color values of an external light incident into a back surface of the transparent display panel; and
a controller configured to adjust the image on the transparent display panel based on the color values of the external light,
wherein the controller is configured to adjust color distortion of the image by limiting a brightness of the image based on the color values of the external light and at least partially limit emission of the plurality of pixels corresponding to at least one color value of the external light when the at least one color value of the external light is higher than a corresponding color value of the image displayed by the plurality of pixels, and
wherein the controller is configured to adjust at least a gamma value of a gamma curve function for processing the image based on the color values of the incident light.

9. The transparent display device of claim 8, wherein the adjusted gamma value is for one of red, green and blue, and the controller is further configured to adjust gamma values for others of red, green, and blue.

10. The transparent display device of claim 8, wherein the controller is further configured to perform image processing of the image and determine transmittance of light that passes through the plurality of see-through portions based on the image-processed image.

11. The transparent display device of claim 8, wherein the controller is further configured to determine transmittance of light that passes through the plurality of see-through portions and to perform image processing of the image based on the determined transmittance.

12. The transparent display device of claim 8, wherein the controller is configured to adjust the image by analyzing a histogram of the image.

13. The transparent display device of claim 8, wherein the at least one optical sensor is configured to measure a brightness of the external light incident into the back surface of the transparent display panel.

14. The transparent display device of claim 8, wherein the controller is further configured to selectively shield the external light incident into the transparent display panel.

15. The transparent display device of claim 8, wherein the controller is further configured to adjust transmittance of light that passes through the plurality of see-through portions based on mura correction information.

16. The transparent display device of claim 8, wherein the controller is further configured to adjust at least an offset value of the gamma curve function for processing the image based on the color values of the incident light so as to change the image displayed by the plurality of pixels.

17. The transparent display device of claim 8, wherein the controller is further configured to adjust the gamma curve function so as to increase a maximum luminance of the image displayed by the plurality of pixels.

* * * * *